United States Patent
Kim et al.

(10) Patent No.: US 11,282,841 B2
(45) Date of Patent: Mar. 22, 2022

(54) METHOD OF MANUFACTURING SEMICONDUCTOR DEVICE INCLUDING SPACER

(71) Applicant: SAMSUNG ELECTRONICS CO., LTD., Suwon-si (KR)

(72) Inventors: Hyo Sub Kim, Hwaseong-si (KR); Hui Jung Kim, Hwaseong-si (KR); Myeong Dong Lee, Hwaseong-si (KR); Jin Hwan Chun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/037,851

(22) Filed: Sep. 30, 2020

(65) Prior Publication Data

US 2021/0013212 A1  Jan. 14, 2021

Related U.S. Application Data

(63) Continuation of application No. 16/437,620, filed on Jun. 11, 2019, now Pat. No. 10,825,819.

(30) Foreign Application Priority Data

Dec. 14, 2018 (KR) .......................... 10-2018-0162425

(51) Int. Cl.
*H01L 27/108* (2006.01)
*H01L 29/66* (2006.01)

(52) U.S. Cl.
CPC .. *H01L 27/10885* (2013.01); *H01L 27/10805* (2013.01); *H01L 27/10888* (2013.01); *H01L 29/6653* (2013.01); *H01L 29/66553* (2013.01); *H01L 27/10852* (2013.01)

(58) Field of Classification Search
CPC ......... H01L 27/10885; H01L 27/10805; H01L 27/10888; H01L 29/6653; H01L 29/66553; H01L 27/10817; H01L 27/10852
USPC ........ 438/238, 239, 386, 393; 357/499, 296, 357/298, 300
See application file for complete search history.

(56) References Cited

U.S. PATENT DOCUMENTS

| | | | |
|---|---|---|---|
| 8,906,763 B2 | 12/2014 | Park et al. | |
| 9,123,550 B2 | 9/2015 | Son | |
| 9,209,241 B2 | 12/2015 | Kim et al. | |
| 9,287,214 B2 | 3/2016 | Park | |

(Continued)

FOREIGN PATENT DOCUMENTS

KR   10-2017-0103204 A   9/2017

*Primary Examiner* — Thinh T Nguyen
(74) *Attorney, Agent, or Firm* — Lee IP Law, P.C.

(57) ABSTRACT

A semiconductor device includes a substrate, a first impurity implantation region and a second impurity implantation region on the substrate and spaced apart from each other, a storage node contact in contact with the first impurity implantation region, the storage node contact including an upper contact having a first width, and a lower contact having a second width that is greater than the first width at a lower portion of the upper contact, a bit line electrically connected to the second impurity implantation region and configured to cross the substrate, a bit line node contact between the bit line and the second impurity implantation region, and a spacer between the storage node contact and the bit line and between the storage node contact and the bit line node contact.

20 Claims, 26 Drawing Sheets

(56) References Cited

U.S. PATENT DOCUMENTS

| | | |
|---|---|---|
| 9,337,203 B2 | 5/2016 | Hwang et al. |
| 9,419,002 B2 | 8/2016 | Han et al. |
| 9,508,726 B2 | 11/2016 | Son et al. |
| 9,627,387 B2 | 4/2017 | Jung et al. |
| 2009/0294976 A1 | 12/2009 | Lee |
| 2014/0110816 A1 | 4/2014 | Kim et al. |
| 2014/0367825 A1* | 12/2014 | Kim et al. .......... H01L 29/0649 257/522 |
| 2018/0040560 A1 | 2/2018 | Kim et al. |
| 2018/0174971 A1 | 6/2018 | Song et al. |

\* cited by examiner

METHOD OF MANUFACTURING SEMICONDUCTOR DEVICE INCLUDING SPACER

CROSS-REFERENCE TO RELATED APPLICATION

This is a continuation of U.S. patent application Ser. No. 16/437,620 filed Jun. 11, 2019, the content of which are hereby incorporated by reference.

Korean Patent Application No. 10-2018-0162425, filed on Dec. 14, 2018, in the Korean Intellectual Property Office, and entitled: "Semiconductor Device Including Spacer and Method of Manufacturing the Same," is incorporated by reference herein in its entirety.

BACKGROUND

1. Field

Devices and methods consistent with exemplary embodiments relate to a semiconductor device including a spacer and a method of manufacturing the same.

2. Description of the Related Art

Along with increasingly high integration of semiconductor devices, individual circuit patterns have become miniaturized to implement more semiconductor devices in the same area. As integration of semiconductor devices increases, design rules for components of the semiconductor devices decrease. In the semiconductor devices, an insulating material is formed between adjacent conductive structures. With high integration of the semiconductor devices, a distance between the adjacent conductive structures is becoming smaller. Consequently, parasitic capacitance is increased. As the parasitic capacitance is increased, the performance of the semiconductor devices may be degraded.

SUMMARY

According to exemplary embodiments, there is provided a semiconductor device including a substrate, a first impurity implantation region and a second impurity implantation region disposed on the substrate and spaced apart from each other, a storage node contact in contact with the first impurity implantation region, a bit line electrically connected to the second impurity implantation region and configured to cross the substrate, a bit line node contact disposed between the bit line and the second impurity implantation region, and a spacer disposed between the storage node contact and the bit line and between the storage node contact and the bit line node contact, wherein the storage node contact may include an upper contact having a first width and a lower contact having a second width that is greater than the first width at a lower portion of the upper contact.

According to exemplary embodiments, there is provided a semiconductor device including a substrate, a first impurity implantation region and a second impurity implantation region disposed on the substrate and spaced apart from each other, a storage node contact in contact with the first impurity implantation region, a bit line electrically connected to the second impurity implantation region and configured to cross the substrate, a bit line node contact disposed between the bit line and the second impurity implantation region, and a spacer disposed between the storage node contact and the bit line and between the storage node contact and the bit line node contact, wherein the spacer may include a first contact spacer in contact with the storage node contact and the bit line node contact and including an oxide and include a first bit line spacer in contact with the bit line and the first contact spacer and including a nitride.

According to exemplary embodiments, there is provided a method of manufacturing a semiconductor device, the method including forming a first impurity implantation region and a second impurity implantation region in a substrate, wherein the first impurity implantation region is spaced apart from the second impurity implantation region, forming an insulating film on the substrate such that the first impurity implantation region is covered and the second impurity implantation region is exposed, removing a portion of the substrate using the insulating film as an etch mask to form a bit line node contact hole, forming a bit line on the insulating film and forming a bit line node contact in the bit line node contact hole, forming a spacer covering sidewalls of the bit line and the bit line node contact, and forming a storage node contact in contact with the spacer and the first impurity implantation region, wherein the spacer may be formed to include a first sub-spacer in contact with the sidewall of the bit line node contact and a first bit line spacer in contact with the sidewall of the bit line, and the first sub-spacer may be formed to include a material having a dielectric constant that is lower than that of the first bit line spacer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
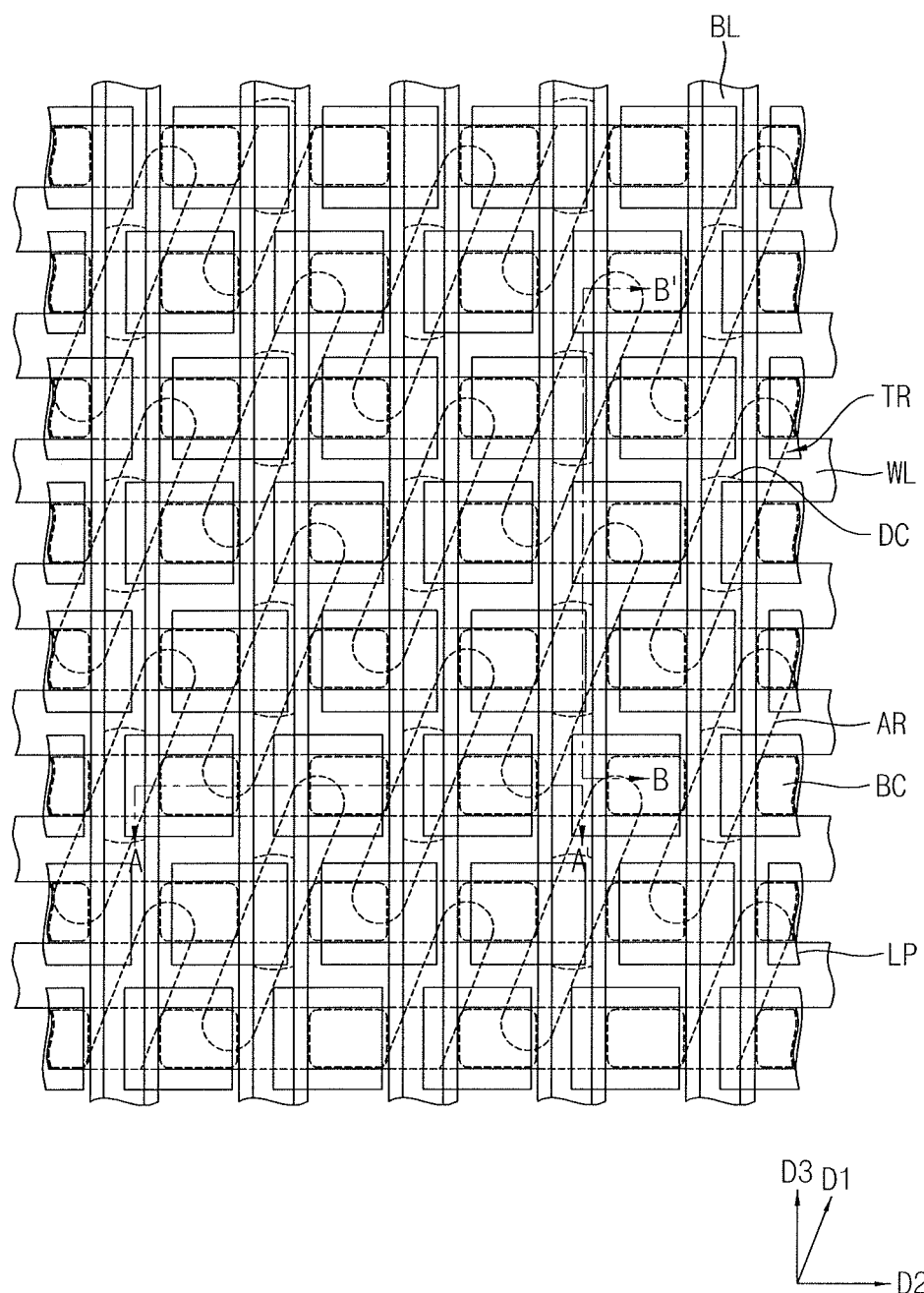
FIG. 1 illustrates a schematic layout of a semiconductor device according to an exemplary embodiment.
Figure 2:
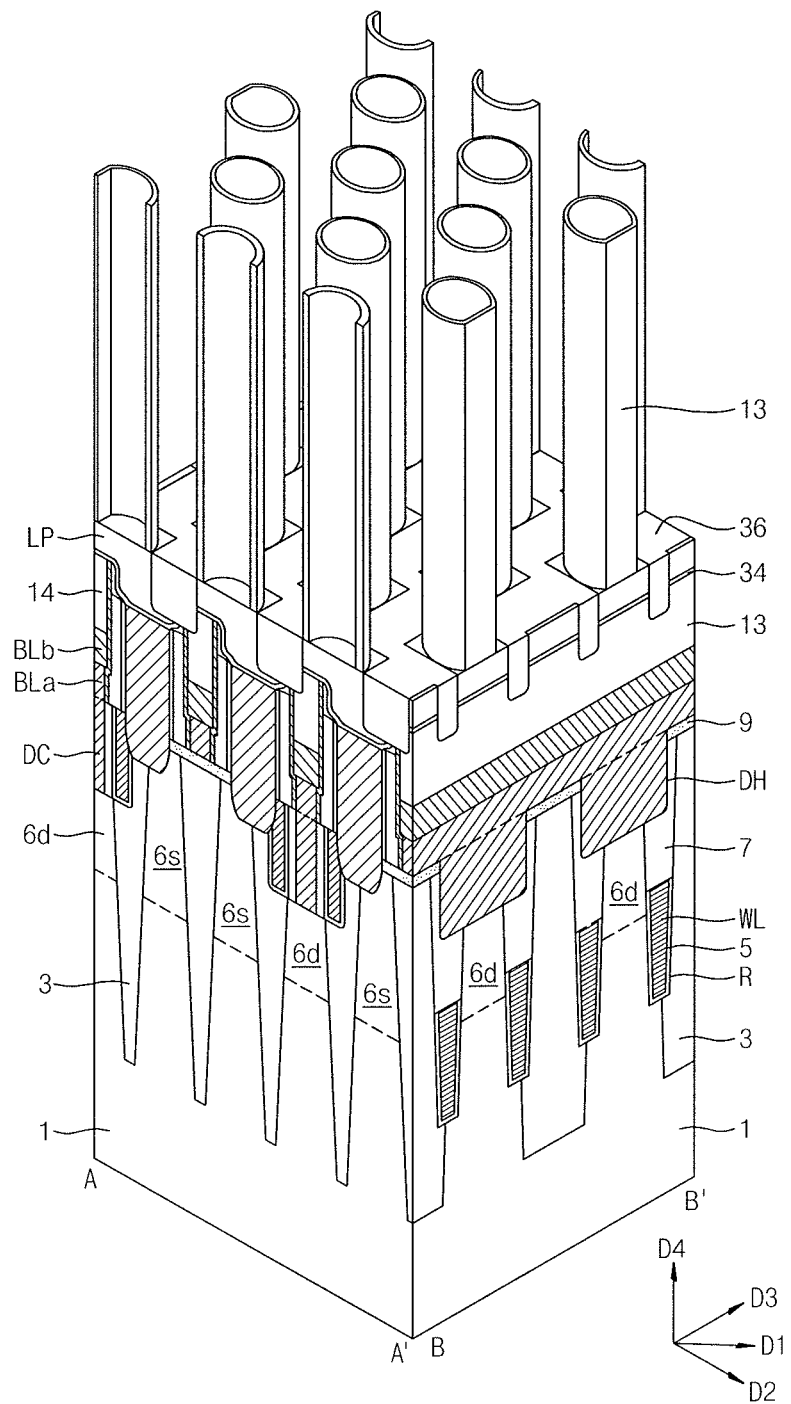
FIG. 2 illustrates a partial perspective view of the semiconductor device and cross sections taken along lines A-A' and B-B' of FIG. 1.
Figure 3:
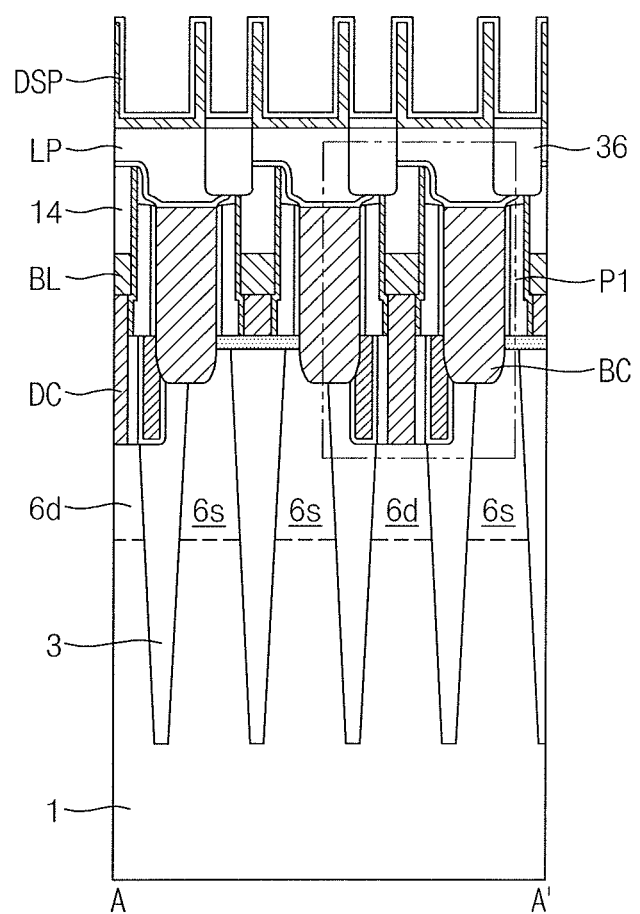
FIG. 3 illustrates a cross-sectional view taken along line A-A' of FIG. 1.
Figure 4A:
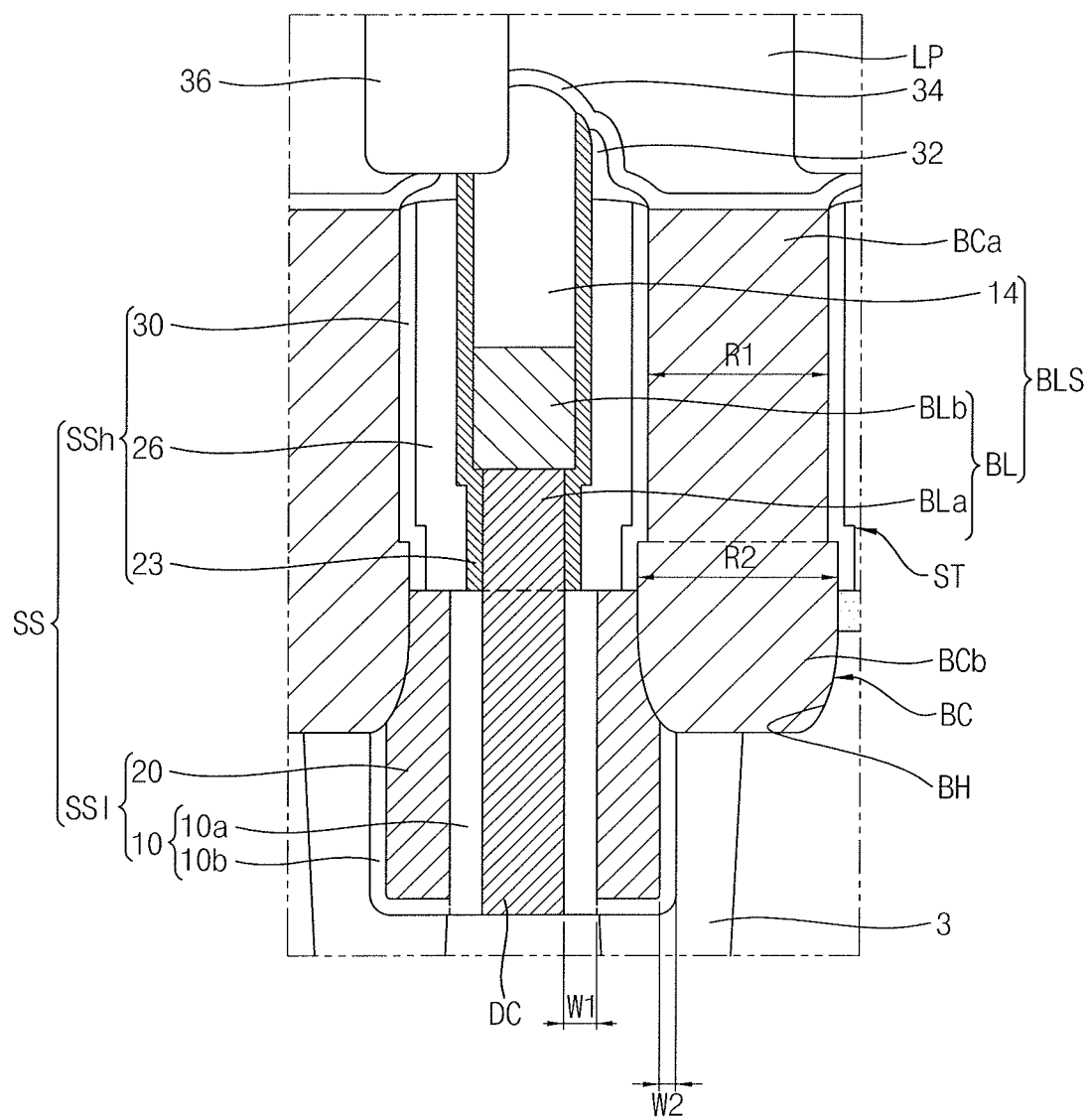
FIG. 4A illustrates an enlarged view of region P1 of FIG. 3 according to an exemplary embodiment.
Figure 4B:
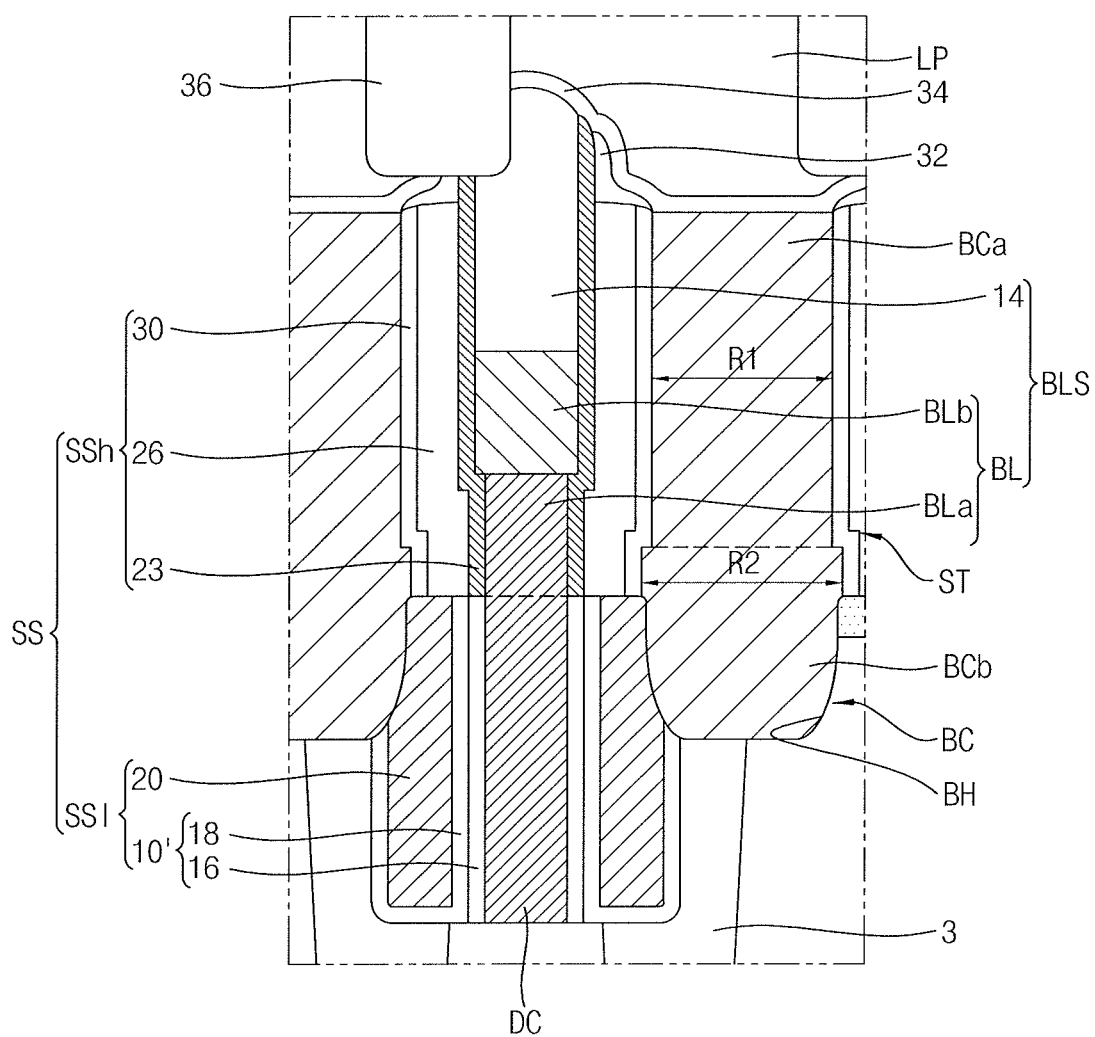
FIG. 4B illustrates an enlarged view of region P1 of FIG. 3 according to another exemplary embodiment.

FIG. 1 is a schematic layout of a semiconductor device according to an exemplary embodiment. FIG. 2 shows a perspective view of the semiconductor device and cross sections taken along lines A-A' and B-B' of FIG. 1. FIG. 3 is a cross-sectional view taken along line A-A' of FIG. 1. FIG. 4A is an enlarged view of Region P1 according to an exemplary embodiment of FIG. 3. FIG. 4B is an enlarged view of Region P1 according to an exemplary embodiment of FIG. 3.

Referring to FIGS. 1 to 3, the semiconductor device may include a substrate 1, a device isolation layer 3, word lines WL, bit lines BL, bit line node contacts DC, storage node contacts BC, spacers SS, landing pads LP, insulation pads 36, and data storage parts DSP.

The device isolation layer 3 for defining active regions AR may be disposed on the substrate 1. The active region AR may have an elongated bar shape in a first direction D1 in a plan view thereof. The plurality of active regions AR may be disposed in parallel. A center of one active region AR may be disposed adjacent to an end portion of another active region AR.

The plurality of word lines WL may be disposed to cross the active region AR and the device isolation layer 3 in the substrate 1 and to extend in a second direction D2. Each of the word lines WL may include at least one film of, e.g., a polysilicon film, a metal silicide film, and a metal film. The second direction D2 intersects the first direction D1. An upper surface of the word lines WL may be disposed lower than an upper surface of the substrate 1.

A gate insulating film 5 may be interposed between each of the word lines WL and the substrate 1. A first impurity implantation region 6s may be disposed in the substrate 1 at one side of the word line WL, and a second impurity implantation region 6d may be disposed in the substrate 1 at the other side of the word line WL, e.g., the second impurity implantation region 6d may be between two first impurity implantation regions 6s in each active region AR and separated by word lines WL (FIGS. 10-12B). A first capping film pattern 7 may be disposed on each of the word lines WL. For example, the first capping film pattern 7 may be formed of a silicon nitride film and/or a silicon oxynitride film.

A first insulating film 9 may be disposed on the substrate 1. The first insulating film 9 may be formed of at least one film among, e.g., a silicon oxide film, a silicon nitride film, and a silicon oxynitride film. The first insulating film 9 may be formed to have a plurality of holes which are formed in an insulating layer covering the active region AR and the device isolation layer 3 on the substrate 1. Alternatively, the first insulating film 9 may be formed in the form of islands which are spaced apart from each other in a plan view thereof. The first insulating film 9 may be formed to simultaneously cover end portions of two adjacent active regions AR.

Bit line node contact holes DH may be formed in portions of the substrate 1 and the device isolation layer 3 by passing through the first insulating film 9. The bit line node contact DC may be disposed in the bit line node contact hole DH. A lower surface of the bit line node contact hole DH (or the bit line node contact DC) may be lower than an upper surface of the substrate 1, e.g., relative to a bottom of the substrate 1. A width of the bit line node contact hole DH parallel to the second direction D2 may be greater than a width of the bit line node contact DC parallel with the bit line node contact hole DH. The bit line node contact DC may be in contact with the second impurity implantation region 6d. The bit line node contact DC may be made of a conductive material. For example, the bit line node contact DC may include at least one film of a metal silicide film, a polysilicon film, a metal nitride film, and a metal film.

Bit line structures BLS may be disposed on the bit line node contacts DC. The bit line structure BLS may be disposed on the first insulating film 9 to extend in a third direction D3 simultaneously intersecting the first direction D1 and the second direction D2. The bit line structure BLS may include the bit line BL and a second capping film pattern 14. The second capping film pattern 14 may be disposed on the bit line BL. The bit line BL may include a metal-containing film. The second capping film pattern 14 may be formed of a material which is the same as that of the first capping film pattern 7. The bit line BL may be electrically connected to the second impurity implantation region 6d via the bit line node contact DC passing through the first insulating film 9.

The spacer SS may be disposed between the bit line structure BLS and the storage node contact BC. A lower portion of the spacer SS may be interposed between the bit line node contact DC and the storage node contact BC, and an upper portion of the spacer SS may be interposed between the bit line structure BLS and the storage node contact BC. The spacer SS may be formed of one single film or multiple films, e.g., at least one of a silicon oxide film, a silicon nitride film, and a silicon oxynitride film.

The storage node contact BC may be disposed between a pair of adjacent bit line structures BLS. The storage node contact BC may be in contact with an outer wall of the bit line structure BLS, e.g., via the upper portion of the spacer SS. The storage node contacts BC may be spaced apart from each other. The storage node contact BC may be formed of, e.g., a polysilicon pattern doped with an impurity. A second insulating film may be disposed between the storage node contacts BC. The second insulating film may separate the storage node contacts BC from one other in the third direction D3. An ohmic layer may be disposed on the storage node contact BC. The ohmic layer may include a metal silicide.

A diffusion prevention pattern 34 may conformally cover upper surfaces of the ohmic layer, the spacer SS, and the second capping film pattern 14. For example, the diffusion prevention pattern 34 may include a metal nitride.

The landing pad LP may be disposed on the diffusion prevention pattern 34. The landing pad LP may be formed of a metal-containing material. The landing pad LP may cover an upper surface of the second capping film pattern 14, and an upper surface of the landing pad LP may have a width that is greater than that of an upper surface of the storage node contact BC, e.g., in the second direction D2.

The insulation pad 36 may be disposed between adjacent landing pads LP to separate the landing pads LP from one other in the second direction D2 and the third direction D3. For example, the insulation pad 36 may be formed of at least one of silicon nitride, silicon oxide, and silicon nitride oxide.

The data storage part DSP may be disposed on the landing pad LP. The data storage part DSP may be electrically connected to the first impurity implantation region 6s via the landing pad LP and the storage node contact BC. Each of the data storage part DSP and the bit line BL may be electrically connected to the first impurity implantation region 6s and the second impurity implantation region 6d of each transistor TR. The data storage part DSP may be implemented in various forms for storing logical data. The data storage part DSP may be a capacitor including a lower electrode, a dielectric film, and an upper electrode. Alternatively, the data storage part DSP may include a magnetic tunnel junction pattern. Alternatively, the data storage part DSP may include a phase change material or a variable resistance material.

Referring to FIGS. 3 and 4A, the bit line structure BLS may include the bit line BL and the second capping film pattern 14. The bit line BL may be disposed on the bit line node contact DC and the first insulating film 9, and the second capping film pattern 14 may be disposed on the bit line BL.

The bit line BL may include a first bit line BLa and a second bit line BLb. The first bit line BLa may be disposed on the bit line node contact DC and the first insulating film 9, and the second bit line BLb may be disposed on the first bit line BLa, e.g., the first bit line BLa may be between the bit line node contact DC and the second bit line BLb.

A width of the first bit line BLa parallel with the second direction D2 may be equal to a width of the bit line node contact DC parallel with the second direction D2. A sidewall of the first bit line BLa may be aligned, e.g., coplanar, with a sidewall of the bit line node contact DC. The first bit line BLa may be formed of a material which is the same as that of the bit line node contact DC. In an exemplary embodiment, a width of the second bit line BLb parallel with the second direction D2 may be greater than the width of the first bit line BLa parallel with the second direction D2. A step may be formed at the bit line BL between the sidewalls of the first bit line BLa and the second bit line BLb.

Consequently, when a storage node contact hole BH for forming the storage node contact BC is formed, a wide width of the storage node contact hole BH may be secured due to the step formed at the bit line BL, e.g., an increased wide width of the storage node contact hole BH may be formed in a region of a reduced width of the first bit line BLa (FIG. 4A). The width of the storage node contact hole BH may extend in the second direction D2. A width of the storage node contact BC disposed in the storage node contact hole BH may also be extended.

The spacer SS may include an upper spacer SSh located at a level corresponding to the bit line BL and a lower spacer SSl located at a level corresponding to the bit line node contact DC. That is, the upper spacer SSh may extend along sidewalls of the bit line BL, while the lower spacer SSl may extend along sidewalls of the bit line node contact DC. The lower spacer SSl may be interposed between the bit line node contact DC and the storage node contact BC to cover the sidewall of the bit line node contact DC. An outer wall of the lower spacer SSl may be in contact with the device isolation layer 3 and the storage node contact BC. The upper spacer SSh may be connected to an upper end of the lower spacer SSl. The upper spacer SSh may be interposed between the bit line BL and the storage node contact BC to cover the sidewall of the bit line BL.

The lower spacer SSl may include a first contact spacer 10 and a second contact spacer 20. The second contact spacer 20 may be interposed between the first contact spacers 10. The first contact spacer 10 may surround a lower surface and both sides of the second contact spacer 20. The first contact spacer 10 may be made of a material having a dielectric constant that is lower than that of the second contact spacer 20. Alternatively, the first contact spacer 10 may be made of a material having an etch selectivity with respect to the second contact spacer 20. For example, the first contact spacer 10 may include silicon oxide, and the second contact spacer 20 may include silicon nitride.

The first contact spacer 10 may include a first portion 10a interposed between the bit line node contact DC and the second contact spacer 20 and a second portion 10b interposed between the device isolation layer 3 and the second contact spacer 20. One side surface of the first portion 10a may be in contact with the bit line node contact DC and the other side surface thereof may be in contact with the second contact spacer 20. A lower surface of the first portion 10a may be in contact with the second impurity implantation region 6d. An inner surface of the second portion 10b may be in contact with the second contact spacer 20 and an outer surface thereof may be in contact with the device isolation layer 3. One end of the second portion 10b may be in contact with the first portion 10a and the other end thereof may be in contact with the storage node contact BC. For example, as illustrated in FIG. 4A, the second portion 10b may extend from a bottom of the first portion 10a along a bottom and a lateral side of the second contact spacer 20 to contact a bottom of the storage node contact BC, e.g., bottommost surfaces of the first and second portions 10a and 10b may be level with each other.

In an exemplary embodiment, a thickness W1 of the first portion 10a, e.g., along the second direction D2, may be greater than a thickness W2 of the second portion 10b, e.g., along the second direction D2. For example, the thickness W1 of the first portion 10a may be in the range of approximately 1.5 to 2.5 times the thickness W2 of the second portion 10b. The first portion 10a made of a low-k dielectric oxide is disposed on the, e.g., entire, sidewall of the bit line node contact DC such that disturbance between the bit line node contact DC (or the bit line BL) and the storage node contact BC (BL to BC disturbance (BBD)) may be reduced. As the thickness W1 of the first portion 10a becomes larger, a reduction effect of the BBD may be increased.

When the BBD is reduced due to the first portion 10a and the storage node contact hole BH for forming the storage node contact BC is formed, a thickness of the spacer SS is decreased such that a width of the storage node contact hole BH may be increased. The thickness W1 of the first portion 10a is increased to be greater than the thickness W2 of the second portion 10b, and the thickness of the second portion 10b is maintained with a small thickness. Thus, even when the storage node contact hole BH is enlarged so as to form the storage node contact BC, a separation distance in which the BBD between the storage node contact BC and the bit line node contact DC cannot occur may be maintained. In other words, when a width of the storage node contact hole BH is increased in the second direction D2, e.g., toward the bit line node contact DC, even though portions of the spacer SS are removed, a thickness of the first portion 10a along the bit line node contact DC is maintained unchanged and sufficiently thick to provide a separation distance between the storage node contact BC and the bit line node contact DC with reduced BBD.

The second contact spacer 20 may be disposed between the first portion 10a and the second portion 10b of the first contact spacer 10. A level of an upper end of the second contact spacer 20 may be equal to or higher than a level of an upper end of the first portion 10a, e.g., uppermost surfaces of the second contact spacer 20 and the first portion 10a may be level with each other. A first sidewall of the second contact spacer 20 may be in contact with a sidewall of the first portion 10a, and a portion of a second sidewall and the lower surface of the second contact spacer 20 may be in contact with the second portion 10b. A portion of the second sidewall of the second contact spacer 20, which is not in contact with the second portion 10b, may be in contact with the storage node contact BC.

The upper spacer SSh may include a first bit line spacer 23, a second bit line spacer 26, and a third bit line spacer 30. The upper spacer SSh may further include a fourth bit line spacer 32.

The first bit line spacer 23 may cover the sidewall of the bit line structure BLS. A lower end of the first bit line spacer 23 may be in, e.g., direct, contact with an upper end of the first contact spacer 10. A thickness of the first bit line spacer 23 may be smaller than or equal to a thickness of the first contact spacer 10, e.g., along the second direction D2. Alternatively, the thickness of the first bit line spacer 23 may be greater than the thickness of the first contact spacer 10. The first bit line spacer 23 may have a step along the sidewall of the bit line structure BLS. For example, as illustrated in FIG. 4A, the first bit line spacer 23 may have a uniform thickness along the second direction D2, so a step may be formed in the first bit line spacer 23 at a region where the first and second bit lines BLa and BLb are connected to each other. The first bit line spacer 23 may include a material having an etch selectivity with respect to the first contact spacer 10. For example, the first bit line spacer 23 may include silicon nitride.

The first bit line spacer 23 is not formed at a level that is lower than a level of the bit line BL. The first bit line spacer 23 is not formed in the bit line node contact hole DH. Consequently, during the formation of the lower spacer SSl, a space in which the second contact spacer 20 is formed in the bit line node contact hole DH may be sufficiently secured.

The second bit line spacer 26 may cover a side surface of the first bit line spacer 23. A step may be formed on an inner wall of the second bit line spacer 26 along the step formed on the sidewall of the first bit line spacer 23. In an example embodiment, a step may also be formed on an outer wall of the second bit line spacer 26. A lower end of the second bit line spacer 26 may be in, e.g., direct, contact with the upper end of the second contact spacer 20 and an upper end of the first portion 10a. An upper end of the second bit line spacer 26 may be lower than the first bit line spacer 23. The second bit line spacer 26 may be made of a material having an etch selectivity with respect to the first bit line spacer 23. For example, the second bit line spacer 26 may include silicon oxide.

The third bit line spacer 30 may cover a sidewall of the second bit line spacer 26. When the step is formed on the outer wall of the second bit line spacer 26, the third bit line spacer 30 may have a step ST. A lower end of the third bit line spacer 30 may be in, e.g., direct, contact with the upper end of the second contact spacer 20. The third bit line spacer 30 may be in, e.g., direct, contact with the sidewall of the storage node contact BC. For example, the third bit line spacer 30 may include silicon nitride.

The fourth bit line spacer 32 may cover an exposed sidewall of the first bit line spacer 23 without being covered with the second bit line spacer 26. The fourth bit line spacer 32 may cover upper surfaces of the second bit line spacer 26 and the third bit line spacer 30. For example, the fourth bit line spacer 32 may include silicon nitride.

The storage node contact BC may include an upper contact BCa and a lower contact BCb. The upper contact BCa may have a first width R1 corresponding to a shortest distance between adjacent upper spacers SSh in the second direction D2. The lower contact BCb may be disposed below the upper contact BCa and may have a second width R2 that is greater than the first width R1 in the second direction D2. The lower contact BCb may have the second width R2 at a level that is higher than that of an upper surface of the bit line node contact DC, e.g., a top of the lower contact BCb may extend above the upper surface of the bit line node contact DC relative to a bottom of the substrate 1. Both sidewalls, e.g., opposite sidewalls in a cross-section, of the lower contact BCb may extend outward more than, e.g., spaced away horizontally from, respective both sidewalls of the upper contact BCa, e.g., along the second direction D2, such that the lower contact BCb may have the second width R2 that is greater than the first width R1.

Referring to FIG. 4B, a first contact spacer 10' may include a first sub-spacer 16 and a second sub-spacer 18. The first sub-spacer 16 may cover the sidewall of the bit line node contact DC. For example, the first sub-spacer 16 may be formed by oxidizing both sidewalls of the bit line node contact DC.

The second sub-spacer 18 may conformally cover the sidewalls and the lower surface of the storage node contact hole BH and a sidewall of the first sub-spacer 16 in the storage node contact hole BH. For example, a thickness of the second sub-spacer 18 may be substantially equal to that of the first sub-spacer 16. However, embodiments are not limited thereto, and the thickness of the second sub-spacer 18 may be different from that of the first sub-spacer 16. For example, the second sub-spacer 18 may include silicon oxide.

Figure 5:
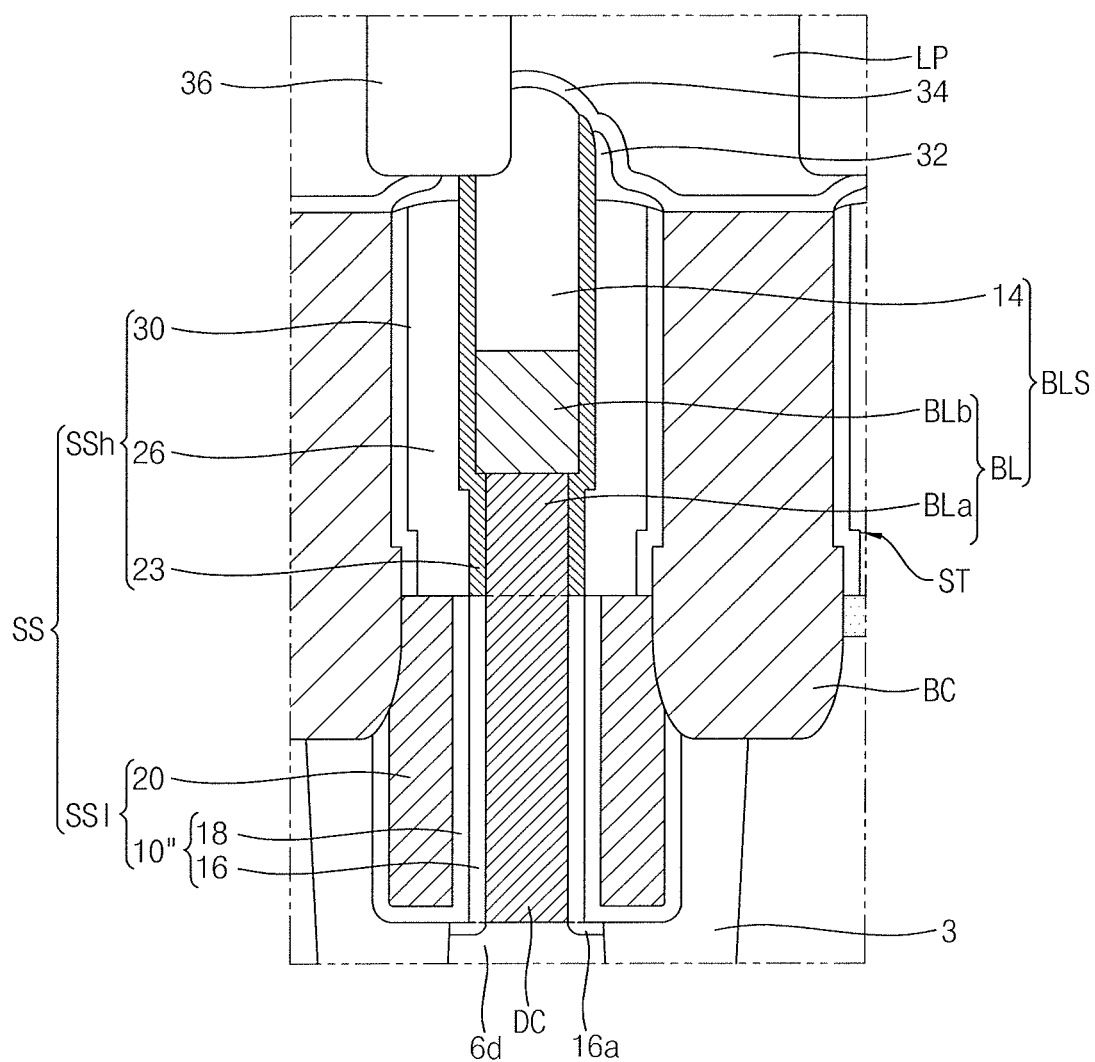
FIG. 5 illustrates an enlarged view of region P1 of FIG. 3 according to another example embodiment.

FIG. 5 is an enlarged view of region P1 according to an example embodiment of FIG. 3. Reference numerals the same as those in FIGS. 1 to 4B denote the same components. For simplicity of description, contents substantially the same as those described in FIGS. 1 to 4B will be omitted below.

Referring to FIG. 5, a first contact spacer 10" may include the first sub-spacer 16, the second sub-spacer 18, and an extension 16a extending from the first sub-spacer 16. The extension 16a may be located at a level that is lower than that of a lower end of the bit line node contact DC. The extension 16a may be formed such that a lower end of the first sub-spacer 16 extends downward outside the bit line node contact DC. The extension 16a may be in contact with a portion of a lower surface of the second sub-spacer 18. The extension 16a may be in contact with the device isolation layer 3. During the formation of the first sub-spacer 16 by oxidizing the bit line node contact DC, the extension 16a may be formed by oxidizing the second impurity implantation region 6d of the substrate 1.

Figure 6A:
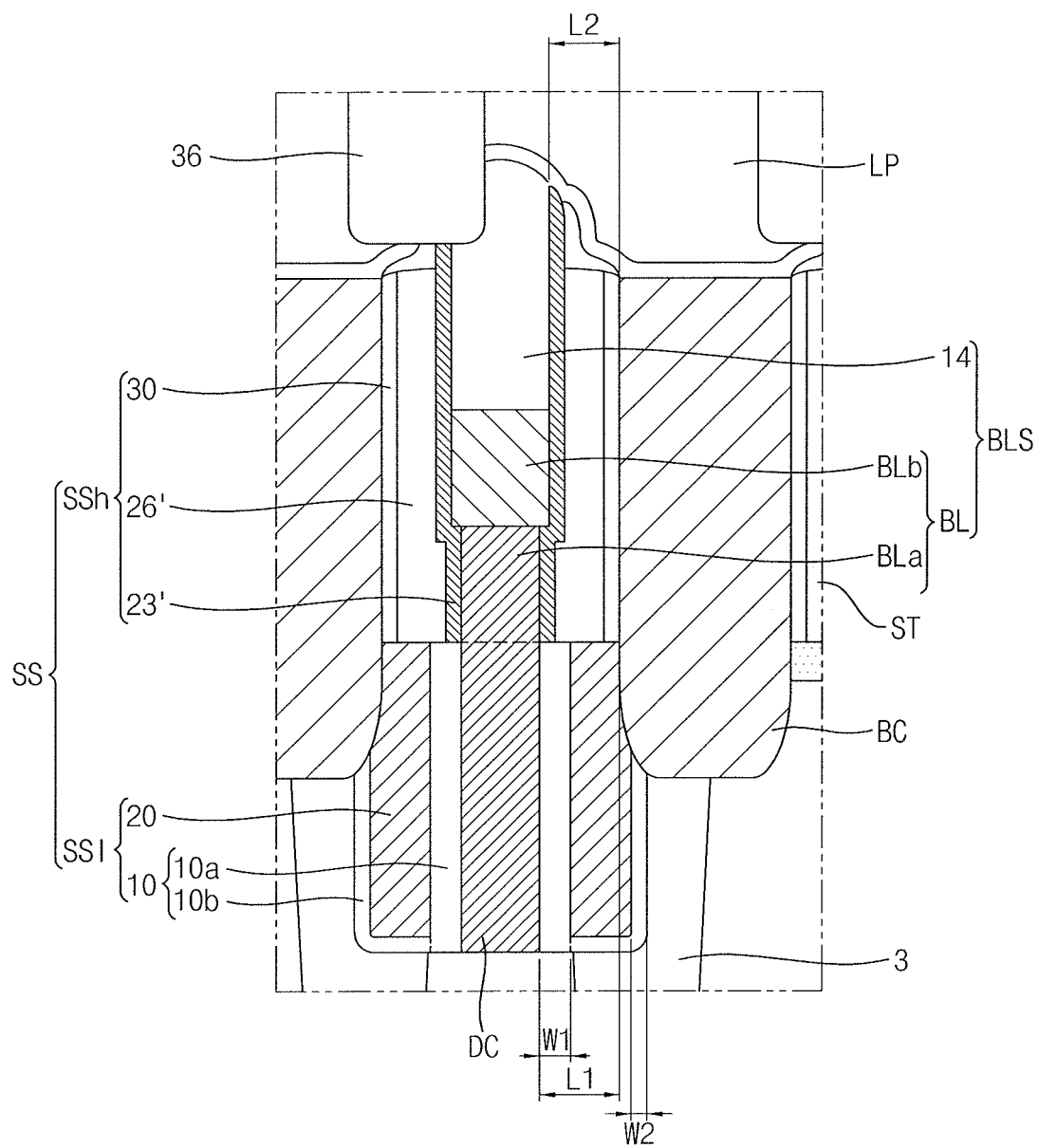
FIG. 6A illustrates an enlarged view of region P1 of FIG. 3 according to another example embodiment.
Figure 6B:
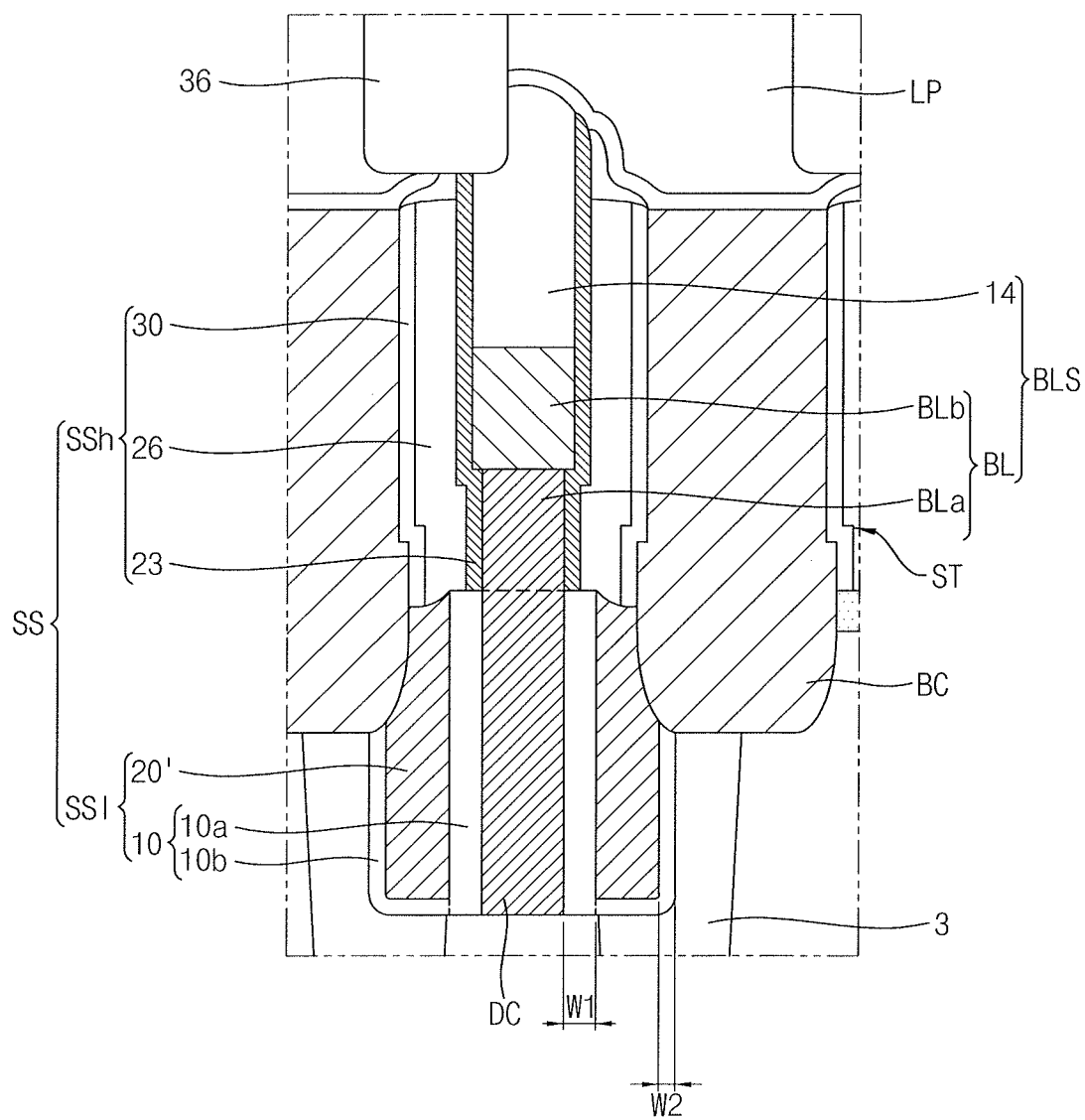
FIG. 6B illustrates an enlarged view of region P1 of FIG. 3 according to another example embodiment.

FIG. 6A is an enlarged view of region P1 according to an example embodiment of FIG. 3. FIG. 6B is an enlarged view of region P1 according to an exemplary embodiment of FIG. 3. Reference numerals the same as those in FIGS. 1 to 5 denote the same components. For simplicity of description, contents substantially the same as those described in FIGS. 1 to 5 will be omitted below.

Referring to FIG. 6A, a step may not be formed on the outer wall of each of the second bit line spacer 26' and the third bit line spacer 30'. For example, during the formation of the storage node contact hole BH, the outer walls of the second bit line spacer 26' and the third bit line spacer 30' are etched such that the step may not be formed. In this case, a shortest distance L1 from one sidewall of the bit line node contact DC (or the first bit line BLa) to the other sidewall of the storage node contact BC may be greater than a shortest distance L2 from the one sidewall of the second bit line BLb to the other sidewall of the storage node contact BC.

Referring to FIG. 6B, the upper surface of a second contact spacer 20' may be a curved surface. In the drawing, the upper end of the second contact spacer 20' has been shown to have a level corresponding to an upper end of the bit line node contact DC, but embodiments are not limited thereto. The upper end of the second contact spacer 20' may be located at a level that is higher or lower than that of the upper end of the bit line node contact DC. An upper surface of the first portion 10a of the first contact spacer 10 has been shown as a flat surface, but the upper surface of the first portion 10a may also be a curved surface.

FIGS. 7 to 29 are diagrams illustrating a process of manufacturing the semiconductor device shown in FIG. 2. In FIGS. 1 to 29, the same reference numerals denote the same components. For simplicity of description, contents substantially the same as those described in FIGS. 1 to 29 will be omitted below.

Figure 7:
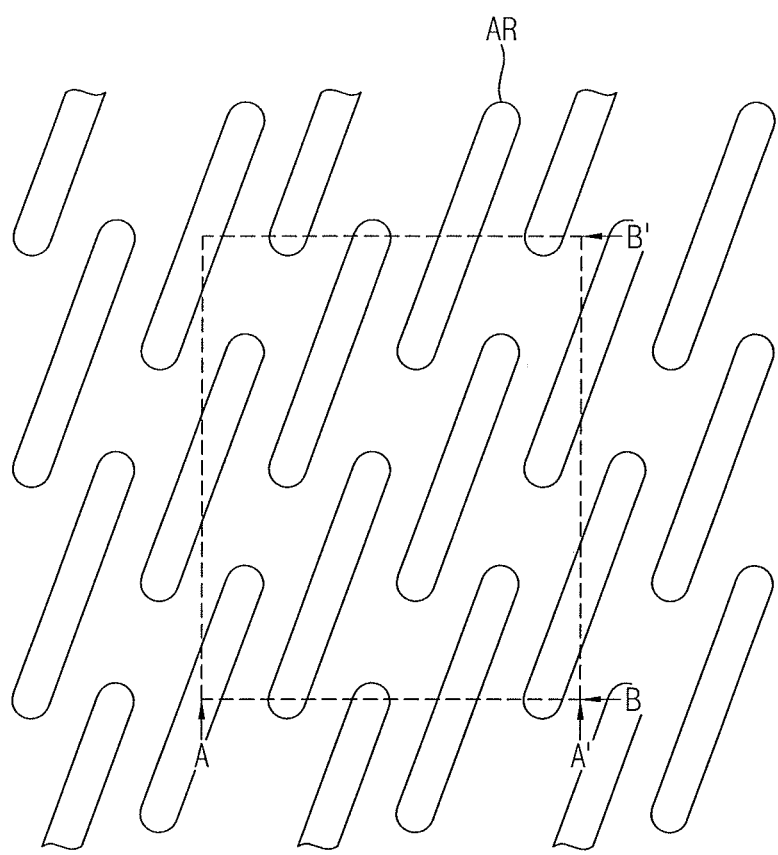
FIGS. 7 to 29 illustrate diagrams of stages in a method of manufacturing a semiconductor device according to an example embodiment.
Figure 8:
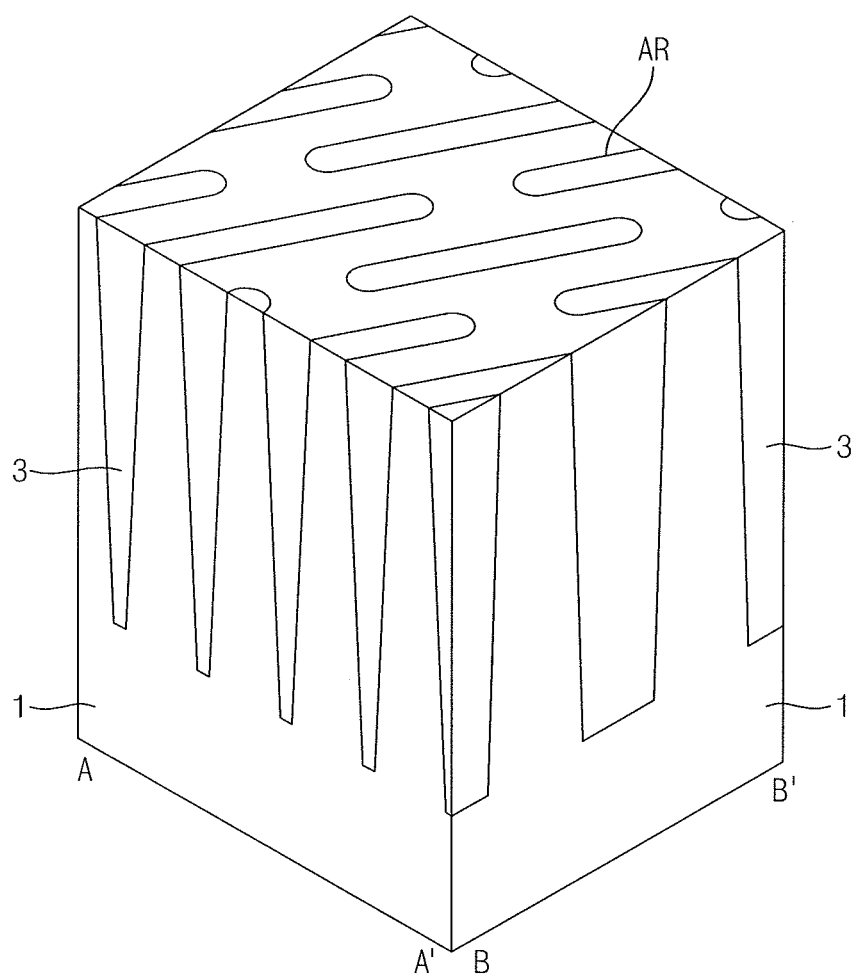

Referring to FIGS. 7 and 8, the device isolation layer 3 may be formed on the substrate 1 to define the active regions AR. For example, the substrate 1 may be a silicon wafer substrate or a silicon on insulator (SOI) substrate. The device isolation layer 3 may be formed by, e.g., a shallow trench isolation (STI) method. For example, the device isolation layer 3 may include at least one among a silicon oxide film, a silicon nitride film, and a silicon oxynitride film.

Figure 9:
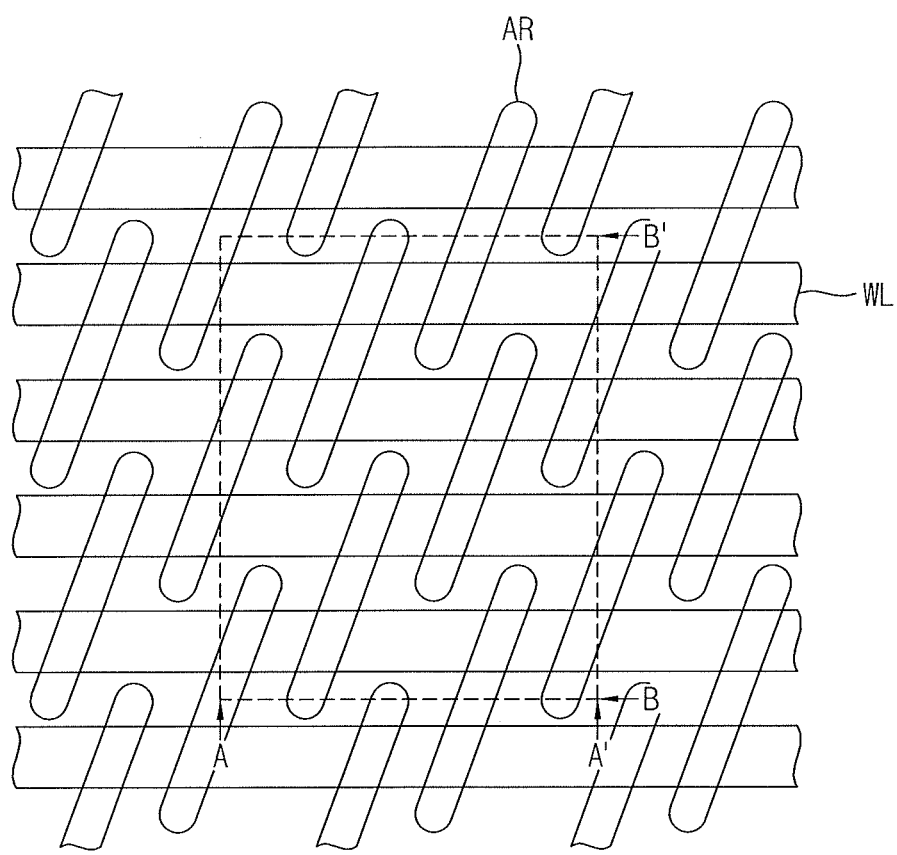
Figure 10:
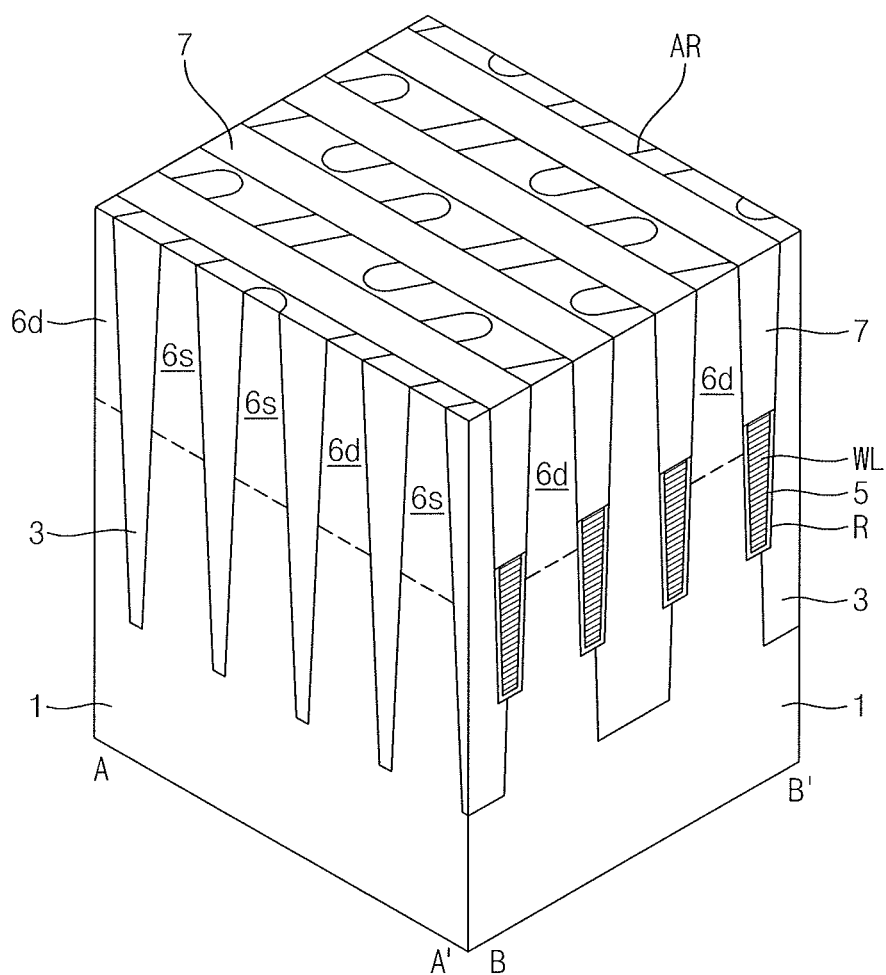

Referring to FIGS. 9 and 10, a plurality of line-shaped first mask patterns may be formed in the second direction D2 on the substrate 1, and the substrate 1 corresponding to the device isolation layer 3 and the active region AR may be etched to form a first recess region R. An etch rate of the device isolation layer 3 may be higher than that of the substrate 1 by controlling an etch recipe and thus a lower surface of the first recess region R may be curved.

The gate insulating film 5 may be formed, e.g., conformally, in the first recess region R. The gate insulating film 5 may be formed of a thermal oxide film. For example, the gate insulating film 5 may be made of at least one insulating material, e.g., silicon oxide, and silicon oxynitride, or metal oxide, e.g., hafnium oxide, aluminum oxide, and zirconium oxide. A conductive film may be stacked in the first recess region R in which the gate insulating film 5 is formed, and the stacked conductive film may be recessed to form the word line WL.

The first capping film pattern 7 may be formed in the first recess region R in which the word line WL is formed, e.g., the first capping film pattern 7 may fill the first recess region R above the word line WL. For example, the first capping film pattern 7 may be formed of a silicon nitride film, a silicon oxynitride film, or a combination thereof.

The first mask pattern may be removed, and the first impurity implantation region 6s and the second impurity implantation region 6d may be formed in the active region AR through ion implantation. The first impurity implantation region 6s and the second impurity implantation region 6d may be doped with the same conductivity type impurity, e.g., an n-type impurity. The first impurity implantation region 6s and the second impurity implantation region 6d may have different depths. To this end, ion implantation may be performed several times.

Figure 11A:
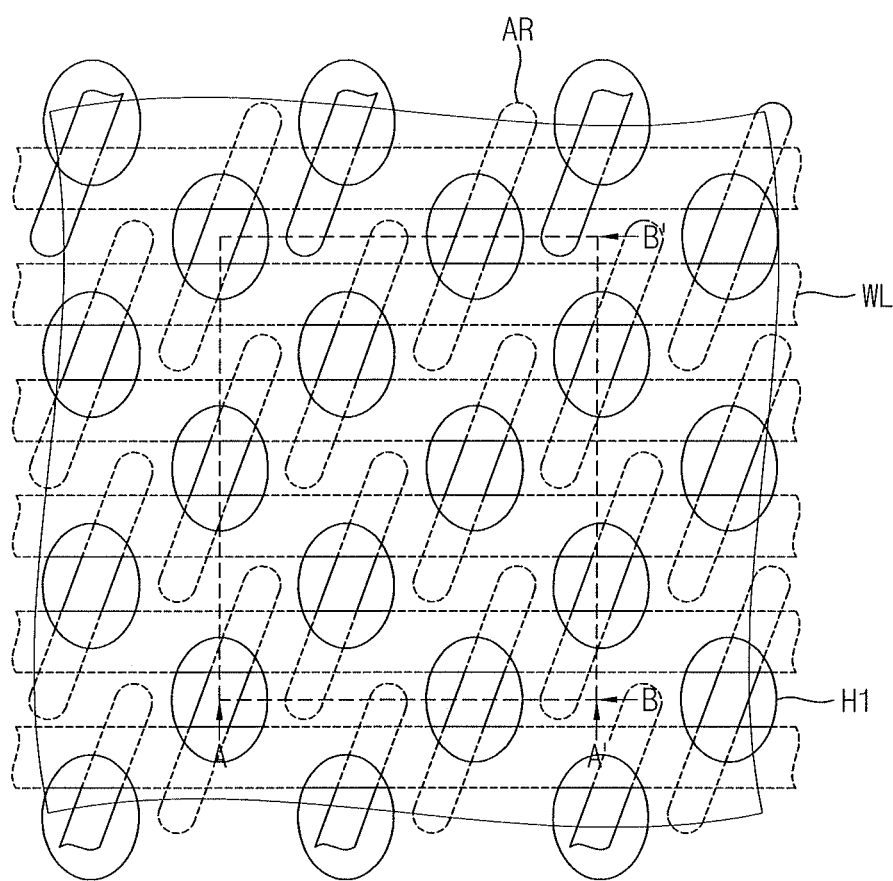
Figure 12A:
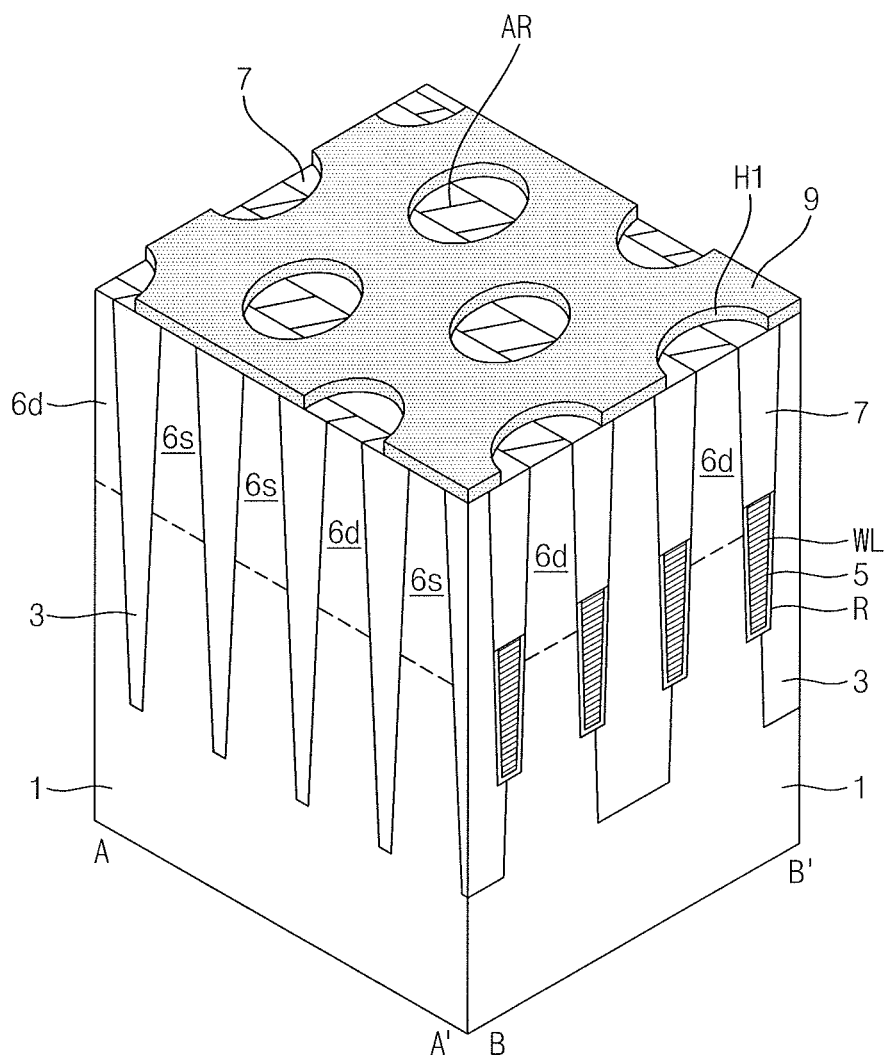

For example, referring to FIGS. 11A and 12A, the first insulating film 9 may be formed on the substrate 1, e.g., as a continuous film covering the entire top surface of the structure. The first insulating film 9 may include at least one material among, e.g., silicon oxide, silicon nitride, and silicon oxynitride. In the drawings, the first insulating film 9 has been shown as a single layer, but the first insulating film 9 may include a plurality of layers made of different materials.

A second mask pattern may be formed on the first insulating film 9, and openings H1 may be formed in the first insulating film 9 through etching in which the second mask pattern is used as an etch mask. The openings H1 may expose the second impurity implantation regions 6d, e.g., while the first impurity implantation region 6s remain covered by the first insulating film 9. Each of the openings H1 may have a diameter that is greater than a width of the second impurity implantation region 6d to expose the device isolation layer 3 and the first capping film pattern 7 which are in the vicinity of each of the openings H1.

Figure 11B:
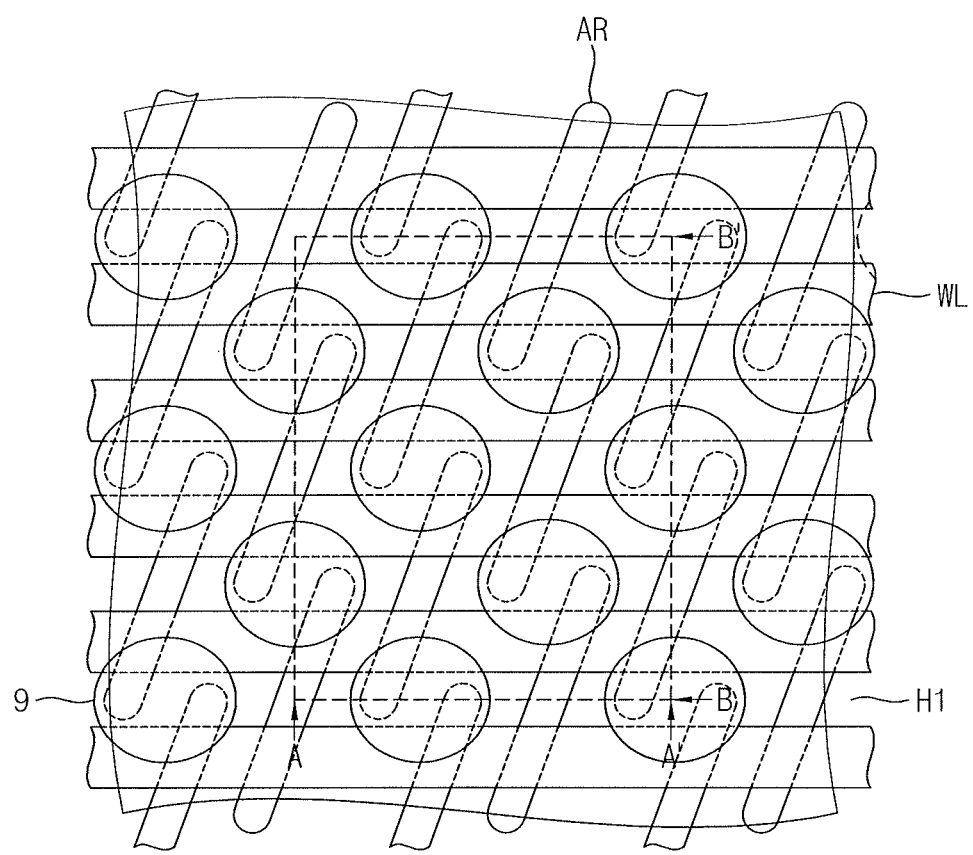
Figure 12B:
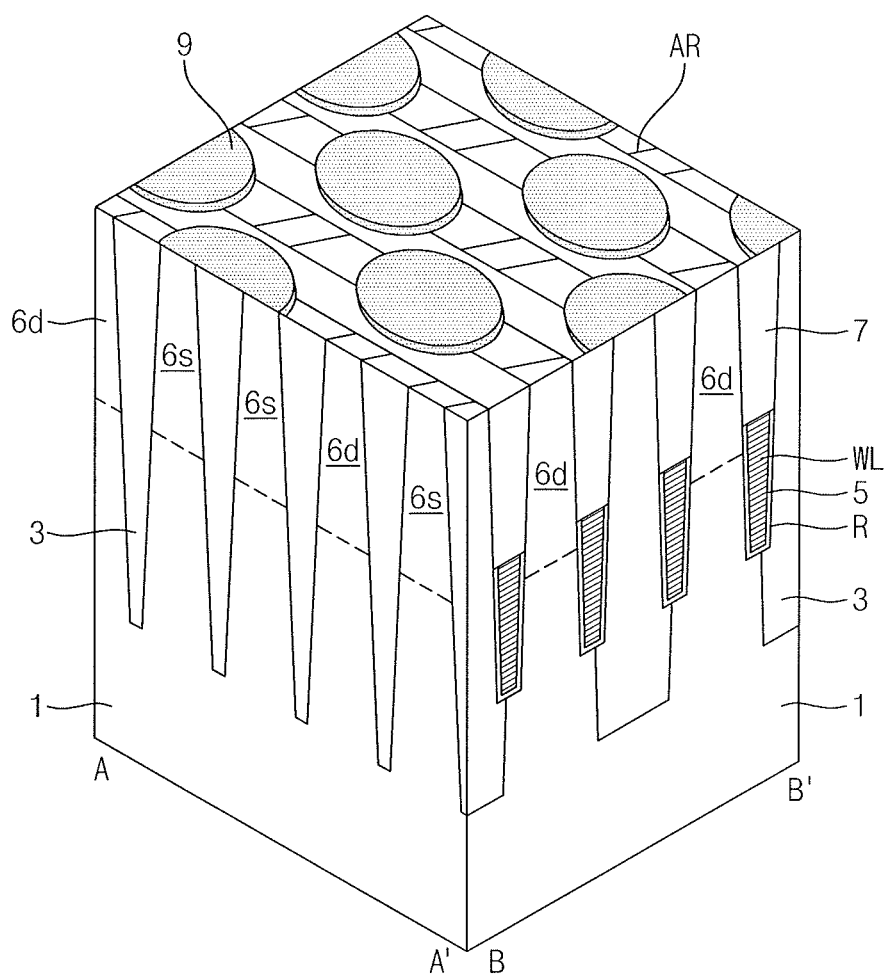

In another example, referring to FIGS. 11B and 12B, unlike FIGS. 11A and 12A, the first insulating film 9 may be formed in a plurality of patterns, i.e., island-shaped patterns spaced apart from each other in a matrix pattern, simultaneously covering ends of adjacent active regions AR, i.e., the first impurity implantation regions 6s. For example, the first insulating film 9 may be formed in an island shape. An insulating film may be formed and patterned on the substrate 1 to form the first insulating film 9. When the island-shaped first insulating film 9 is formed, a polysilicon film may be simultaneously formed and patterned on the insulating film to form a polysilicon pattern on the first insulating film 9. As the first insulating film 9 and the polysilicon pattern are patterned, the device isolation layer 3 and the first capping film pattern 7 in the vicinity of the substrate 1 may be partially etched to form the bit line node contact hole DH.

Figure 13:
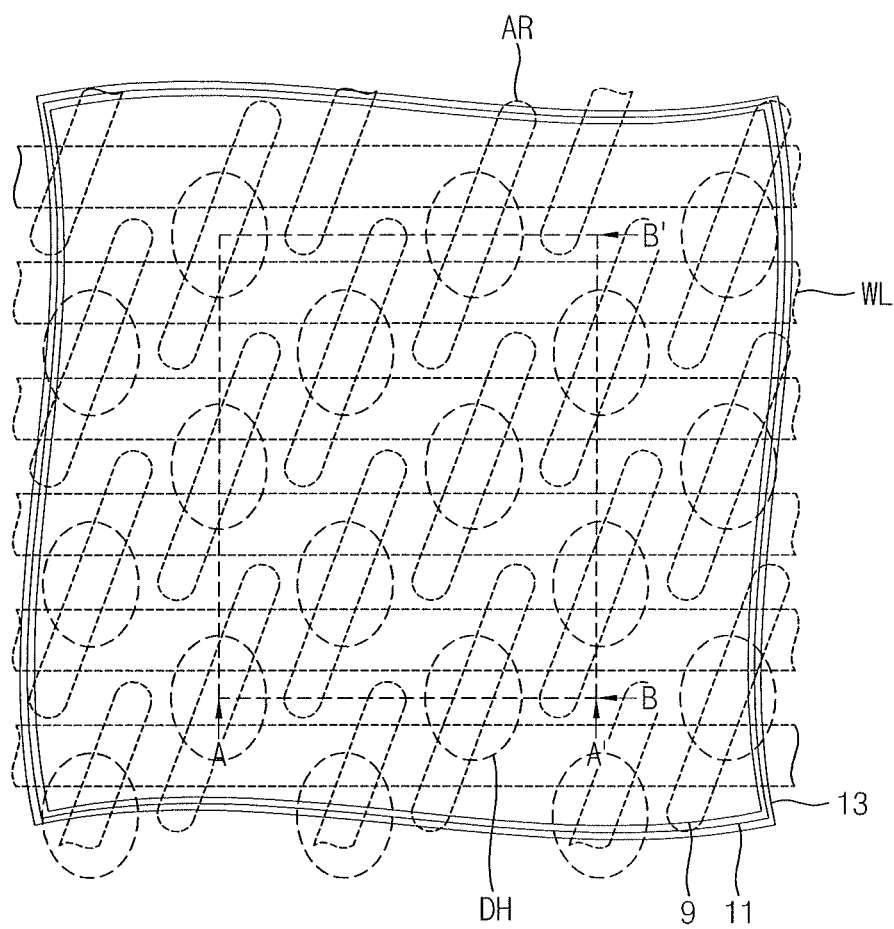
Figure 14:
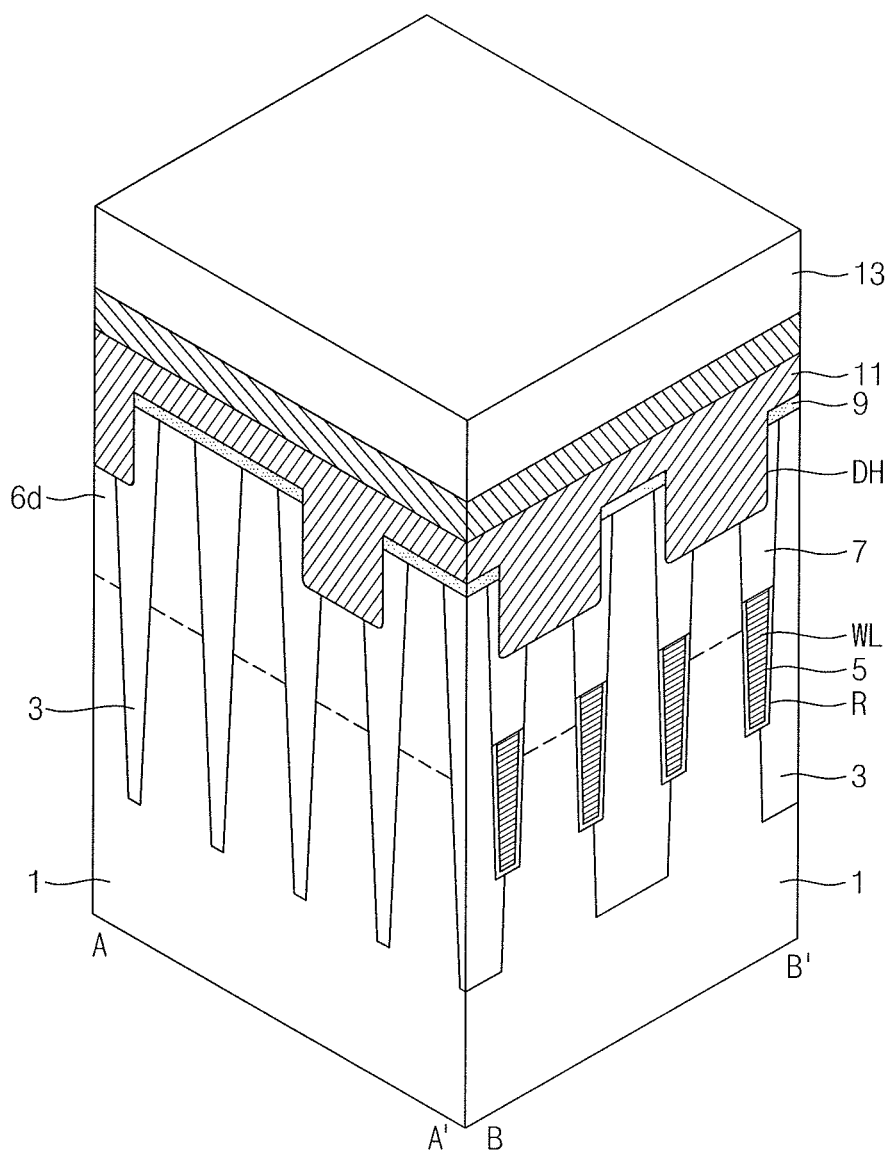
Figure 15:
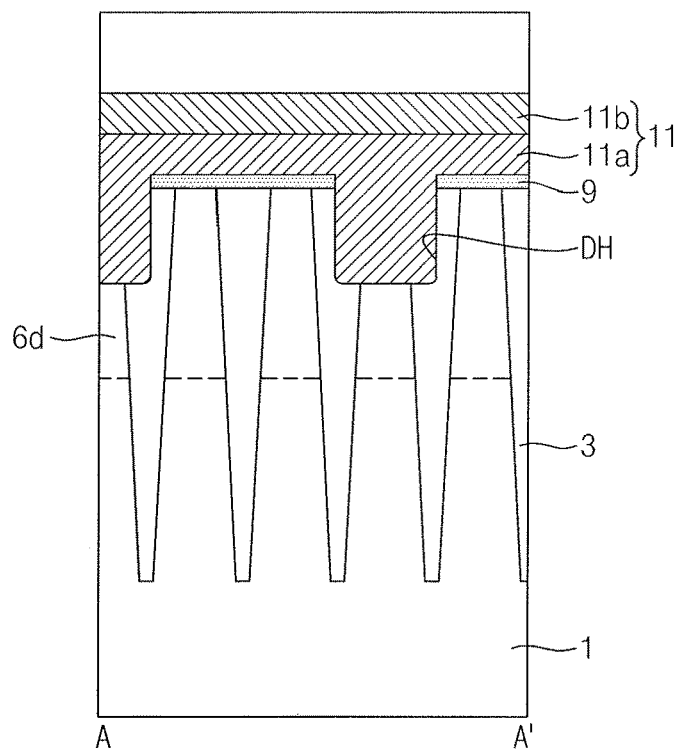

Referring to FIGS. 13 to 15, in the case of performing the process of FIGS. 11A and 12A, the substrate 1 may be exposed by the openings H1 through etching in which the second mask pattern is used as an etch mask, and the device isolation layer 3 and the first capping film pattern 7 in the vicinity of the substrate 1 may be partially etched such that the bit line node contact hole DH may be formed. The lower surface of the bit line node contact hole DH may be formed to be higher than a lower surface of the second impurity implantation region 6d and a lower surface of the first capping film pattern 7. After the bit line node contact hole DH is formed, the second mask pattern may be removed. A conductive film 11 and a second capping film 13 may be sequentially stacked on the first insulating film 9 from which the second mask pattern is removed. The bit line node contact hole DH may be filled with the conductive film 11. The conductive film 11 may be formed by sequentially stacking a first conductive film 11a and a second conductive film 11b. For example, the first conductive film 11a may include polysilicon doped with an impurity. The second conductive film 11b may include a metal, e.g., tungsten, titanium, or tantalum, or a conductive metal nitride, e.g., tungsten nitride, titanium nitride, or tantalum nitride. In the drawing, the second conductive film 11b has been shown as a single layer, but the second conductive film 11 may be formed as a double layer or a stacked structure of three layers or more.

Figure 16:
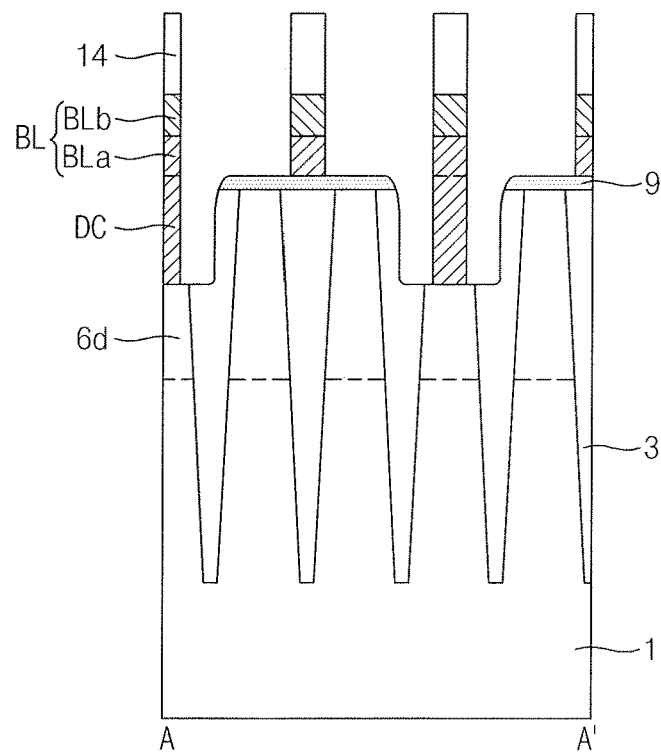

Referring to FIG. 16, the bit line node contact DC, the bit line BL, and the second capping film patterns 14, which are formed by patterning and sequentially stacking the conductive film 11 and the second capping film 13, may be formed in a plurality of lines. The bit line BL may include the first bit line BLa and the second bit line BLb. The first conductive film 11a may be patterned to form the bit line node contact DC in the bit line node contact hole DH and form the first bit line BLa on the bit line node contact DC, i.e., the bit line node contact DC and the first bit line BLa may both be formed simultaneously by patterning the first conductive film 11a. The second conductive film 11b may be patterned to form the second bit line BLb on the first bit line BLa. The second capping film 13 may be patterned to form the second capping film patterns 14 on the second bit lines BLb. During the patterning of the conductive film 11 and the second capping film 13, the first insulating film 9 and the device isolation layer 3 located at an entrance of the bit line node contact hole DH are partially etched such that the entrance of the bit line node contact hole DH may be rounded and broadened.

Figure 17:
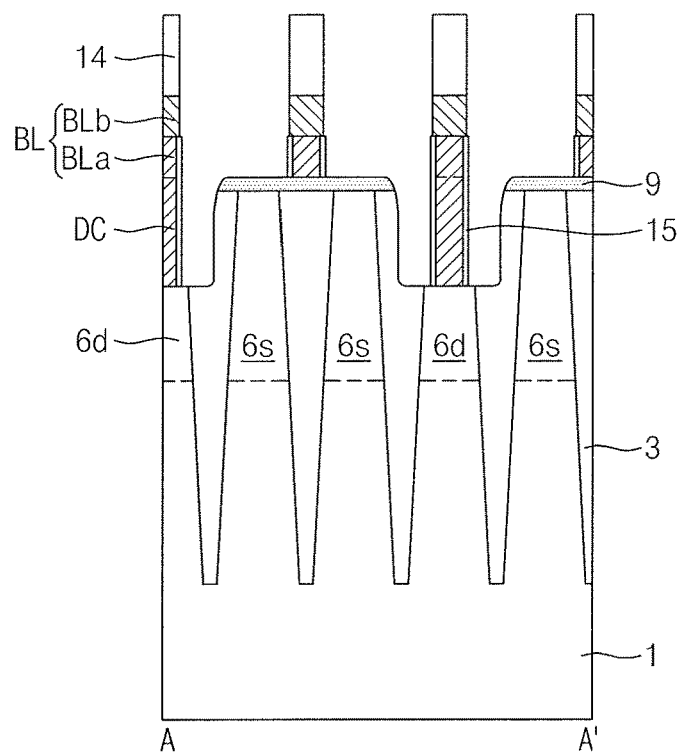

Referring to FIG. 17, side surfaces of the bit line node contact DC and the first bit line BLa are oxidized through selective oxidation such that a first sub-spacer film 15 may be formed. The second impurity implantation region 6d exposed via the bit line node contact hole DH through selective oxidation may also be partially oxidized. For example, selective oxidation may be thermal plasma oxidation. During selective oxidation, the second bit line BLb, e.g., including tungsten, may not be oxidized, and only the bit line node contact DC including polysilicon and only the first bit line BLa may be selectively oxidized.

Figure 18:
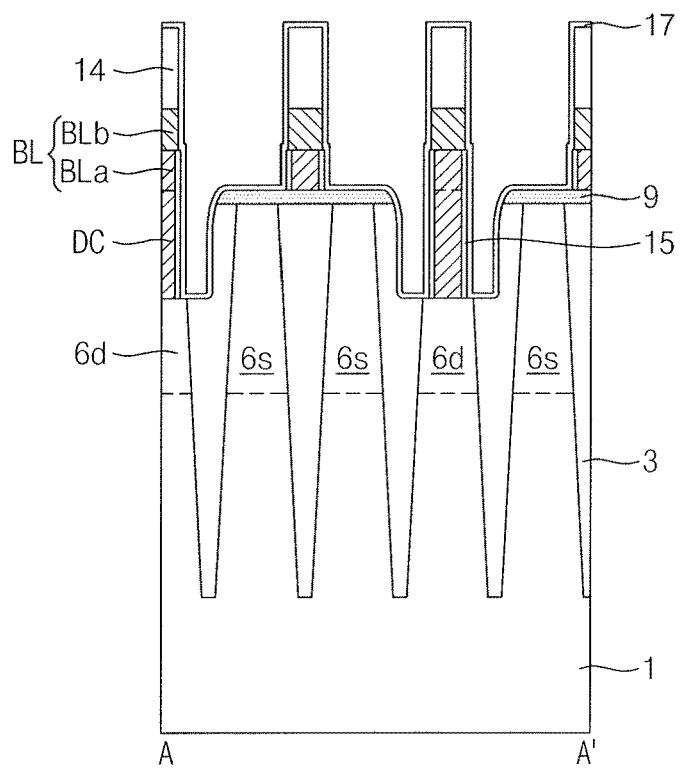

Referring to FIG. 18, a second sub-spacer film 17 may be conformally formed on the substrate 1. The second sub-spacer film 17 may conformally cover a lower surface and a side surface of the bit line node contact hole DH which are not covered with the bit line node contact DC. The second sub-spacer film 17 may cover the first sub-spacer film 15, the second bit line BLb, and the second capping film pattern 14. For example, the second sub-spacer film 17 may include silicon oxide. As shown in FIG. 17, the sidewall of the bit line node contact DC is oxidized, the sidewall of the bit line node contact hole DH is exposed, and then the second sub-spacer film 17 is deposited such that a critical dimension (CD) of the bit line node contact hole DH may be sufficiently secured so as to allow the bit line node contact hole DH to be easily filled with a third sub-spacer film 19 even while a thickness of an oxide disposed on the sidewall of the bit line node contact DC is increased.

Figure 19:
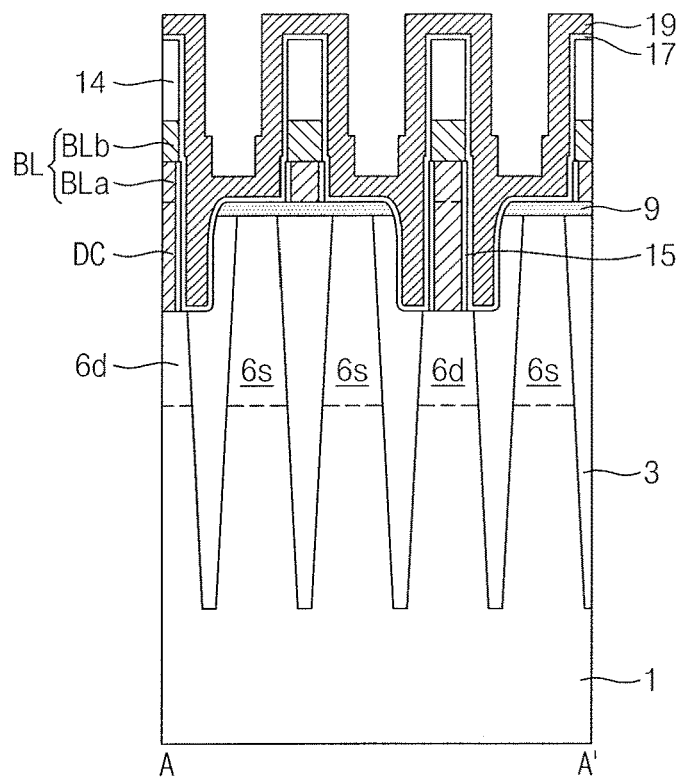

Referring to FIG. 19, the third sub-spacer film 19 may be conformally formed on the second sub-spacer film 17. The third sub-spacer film 19 may be formed to have a thickness sufficient to fill the remaining space in the bit line node contact hole DH. The third sub-spacer film 19 may be formed of a material having an etch selectivity with respect to the first sub-spacer film 15, the second sub-spacer film 17, and a natural oxide film. For example, the third sub-spacer film 19 may include silicon nitride.

Figure 20:
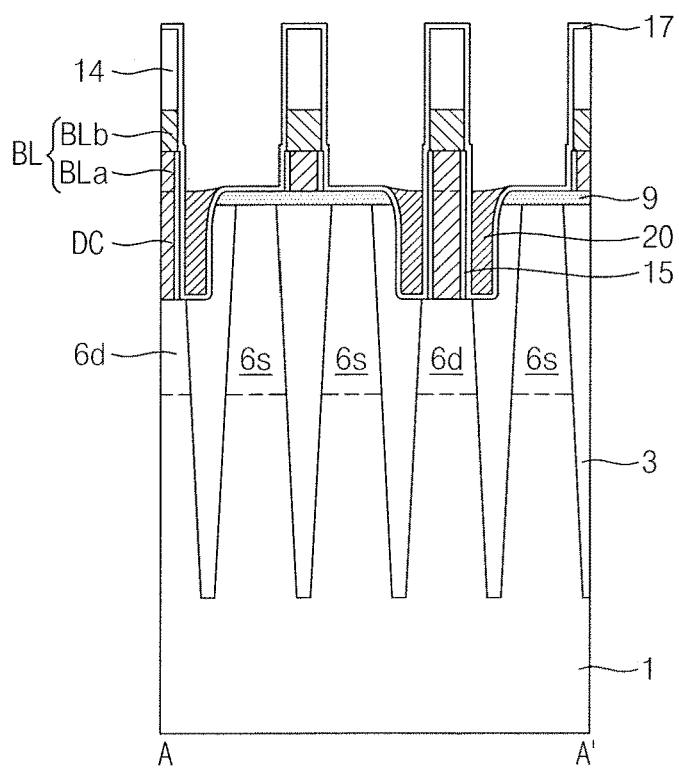

Referring to FIG. 20, the third sub-spacer film 19 may be removed by isotropic etching so as to form a third sub-spacer 20 in the bit line node contact hole DH. The third sub-spacer 20 is the same as the second contact spacer 20 described in FIGS. 4A to 6B. A portion of the second sub-spacer film 17 may be exposed to the outside while the third sub-spacer film 19 is removed. An upper surface of the third sub-spacer 20 may be formed to be curved. For example, isotropic etching may be performed using phosphoric acid. During isotropic etching, the second sub-spacer film 17 may serve as an etch stop layer.

Figure 21:
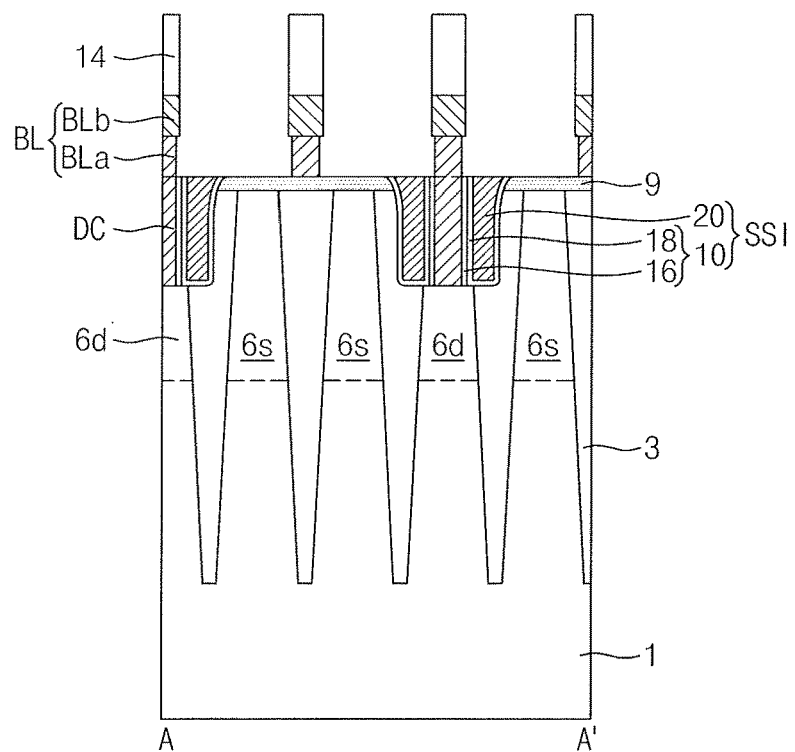

Referring to FIG. 21, the exposed portion of the second sub-spacer film 17 and a portion of the first sub-spacer film 15 may be removed by wet cleaning to form the first sub-spacer 16 and the second sub-spacer 18. The bit line BL and the second capping film pattern 14 on the first sub-spacer 16 may be exposed to the outside. The bit line BL and the second capping film pattern 14 may be exposed above the first sub-spacer 16 and the second sub-spacer 18.

Figure 22:
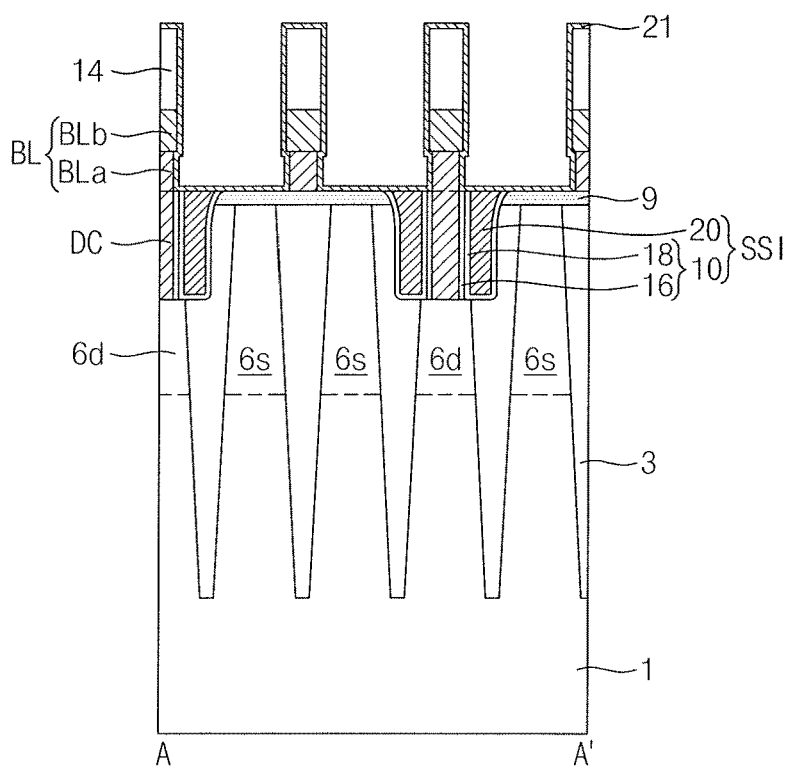

Referring to FIG. 22, a first bit line spacer film 21 may be conformally formed on the substrate 1. The first bit line spacer film 21 may be deposited through plasma nitride treatment. The first bit line spacer film 21 may cover the exposed bit line BL and the exposed second capping film pattern 14. The first bit line spacer film 21 may be formed of a material having an etch selectivity with respect to a natural oxide film. For example, the first bit line spacer film 21 may include silicon nitride.

If the first bit line spacer film 21 were to be formed before formation of the third sub-spacer film 19, i.e., if were to be formed directly on the second sub-spacer film 17 in the bit line node contact hole DH, the CD of the bit line node contact hole DH would have been reduced to make it too difficult to completely fill the bit line node contact hole DH with the bit line spacer film 21. Further, a resultant space above such a bit line spacer film 21 for the bit line node contact hole DH (since would not have been filled with the bit line spacer film 21 due to reduced space) would not have been sufficient to form the third sub-spacer 20 therein.

In contrast, according to exemplary embodiments, the first bit line spacer film 21 is formed after the formation of the third sub-spacer 20, e.g., so the first bit line spacer film 21 covers the top of the third sub-spacer 20 completely filling the bit line node contact hole DH. Therefore, the CD of the bit line node contact hole DH for forming the third sub-spacer 20 may be sufficiently secured.

Figure 23:
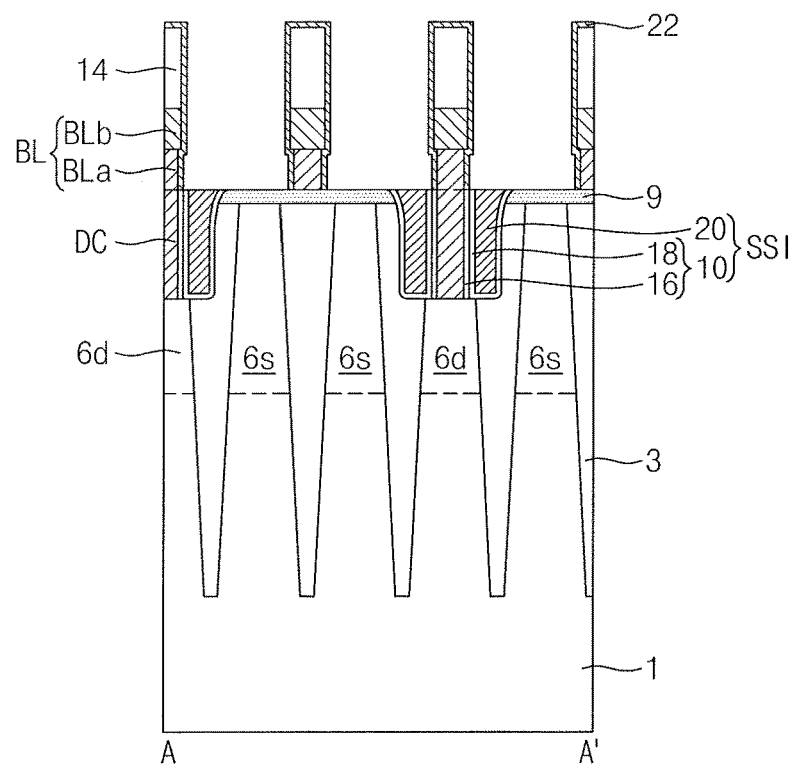

Referring to FIG. 23, the first bit line spacer film 21 may be partially removed by anisotropic etching so as to form a first bit line spacer pattern 22. A mask pattern and a photoresist pattern may be used during the anisotropic etching. The first bit line spacer pattern 22 may cover the bit line BL and the second capping film pattern 14. Upper surfaces of the first insulating film 9, the second sub-spacer 18, and the third sub-spacer 20 may be exposed. At least a portion of an upper surface of the first sub-spacer 16 may be exposed.

Figure 24:
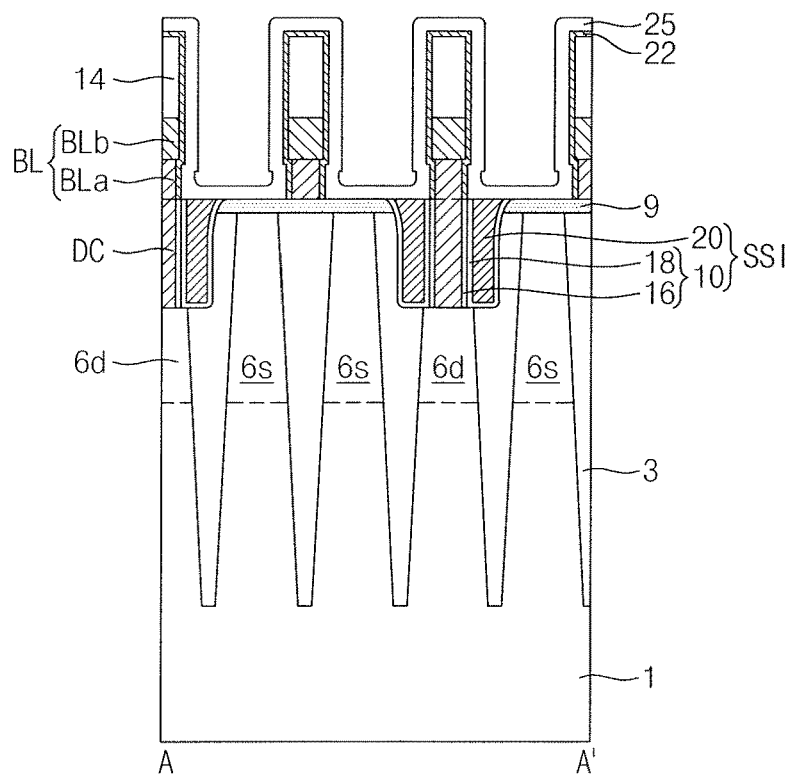

Referring to FIG. 24, a second bit line spacer film 25 may be conformally formed on the substrate 1. The second bit line spacer film 25 may be formed through atomic layer deposition (ALD). The second bit line spacer film 25 may include a material having an etch selectivity with respect to the first bit line spacer pattern 22. For example, the second bit line spacer film 25 may include silicon oxide.

Figure 25:
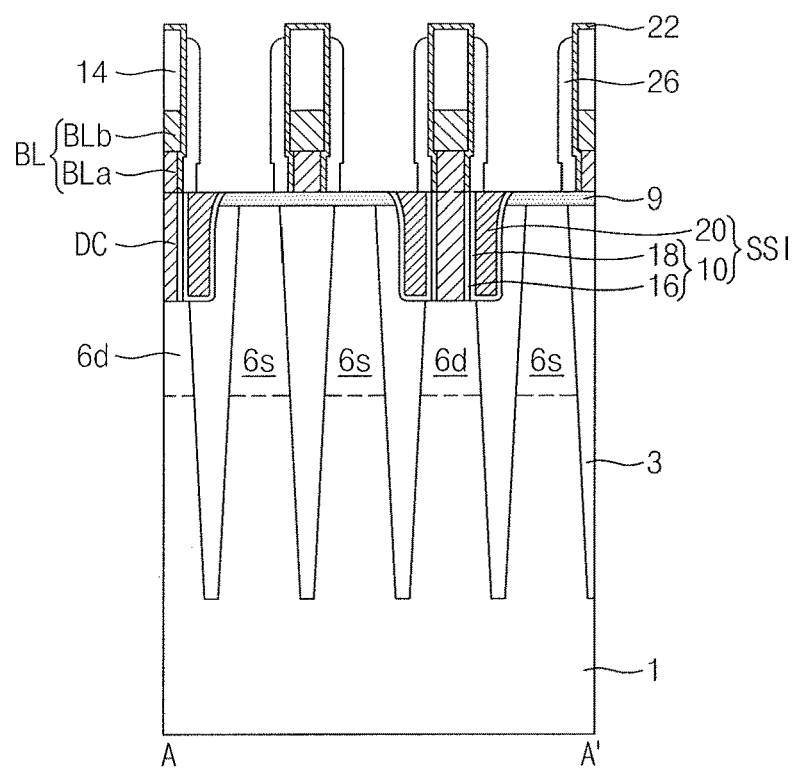

Referring to FIG. 25, the second bit line spacer film 25 may be etched by anisotropic etching to expose an upper portion of the first bit line spacer pattern 22 and form a second bit line spacer 26 covering a sidewall of the first bit line spacer pattern 22. The second bit line spacer 26 is formed such that the upper surfaces of the first insulating film 9 and the third sub-spacer 20 may be partially exposed.

Figure 26:
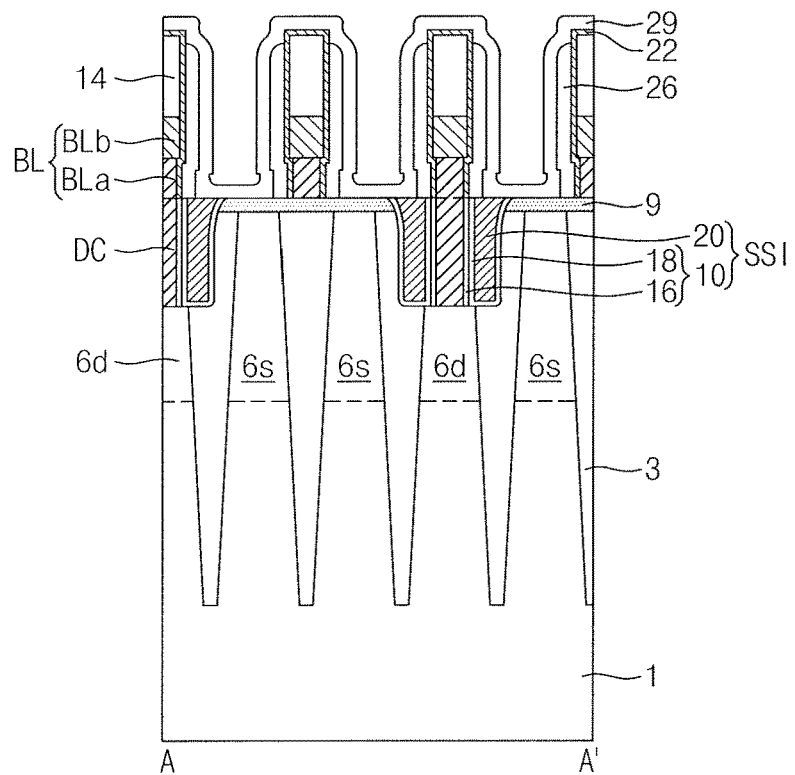

Referring to FIG. 26, a third bit line spacer film 29 may be conformally formed on the substrate 1. The third bit line spacer film 29 may include a material having an etch selectivity with respect to a natural oxide film. For example, the third bit line spacer film 29 may include silicon nitride.

Figure 27:
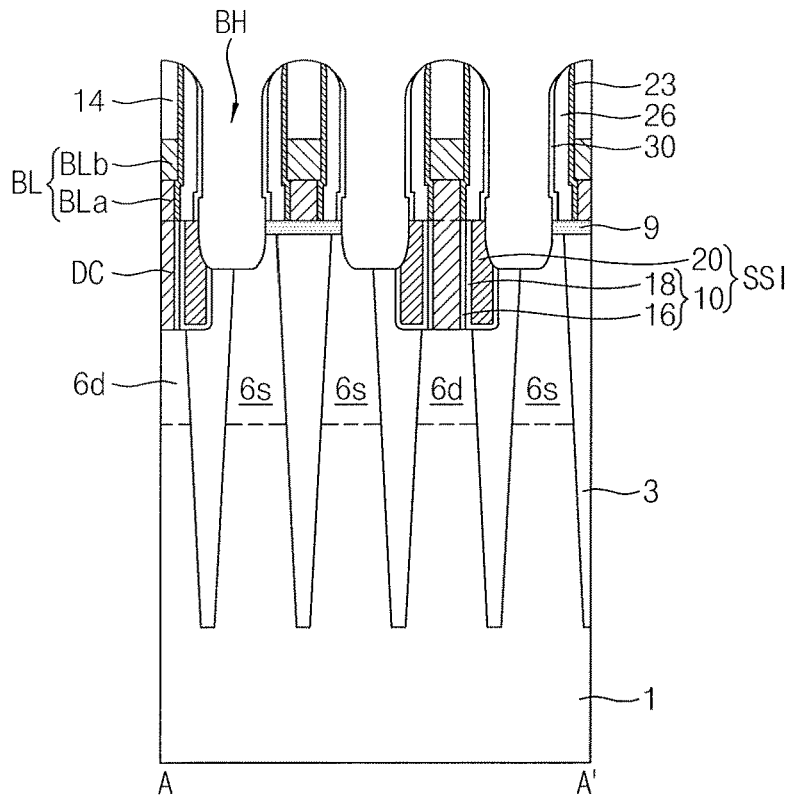

Referring to FIG. 27, the first bit line spacer pattern 22 and the third bit line spacer film 29 may be partially removed by anisotropic etching to form the first bit line spacer 23 and the third bit line spacer 30. An upper spacer including the first to third bit line spacers 23, 26, and 30 may be formed. During anisotropic etching, the second capping film pattern 14 and the second bit line spacer 26 may also be partially etched.

A space between the upper spacers may be filled with a second insulating film. An upper surface of the second insulating film may be located at a level equal to a height of the upper surface of the second capping film pattern 14. For example, the second insulating film may include a silicon nitride film. The second insulating film, the first insulating film 9, the substrate 1, and the device isolation layer 3 are partially removed from a position at which the storage node contact BC will be formed such that the storage node contact hole BH may be formed. The second sub-spacer 18 and the third sub-spacer 20 may also be partially removed. Before the formation of the storage node contact BC filling the storage node contact hole BH, a cleaning process may be performed to remove a natural oxide film which may be formed in the storage node contact hole BH using an etchant containing fluorine.

Figure 28:
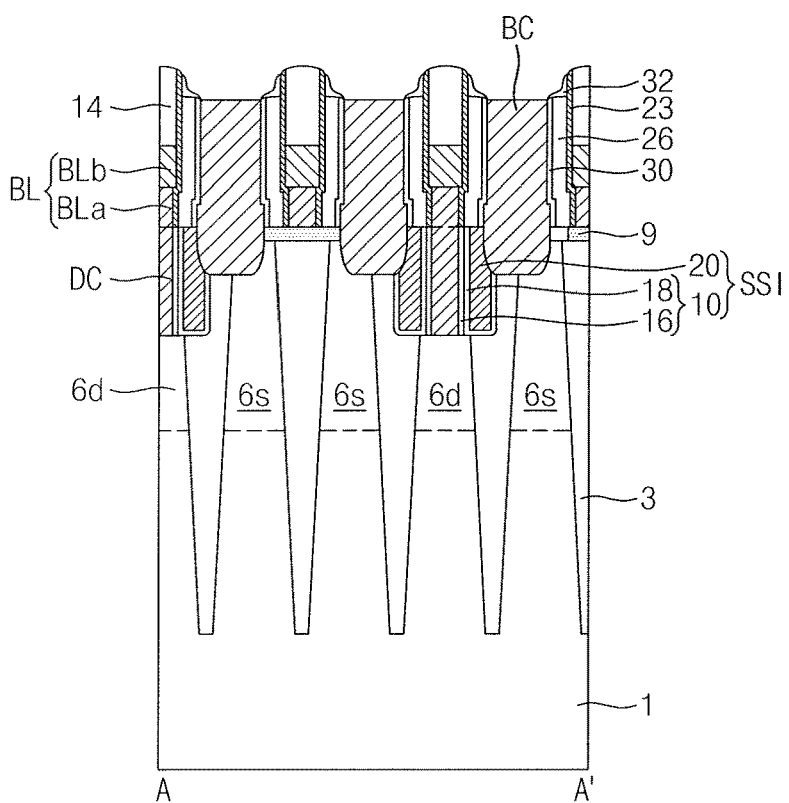
Figure 29:
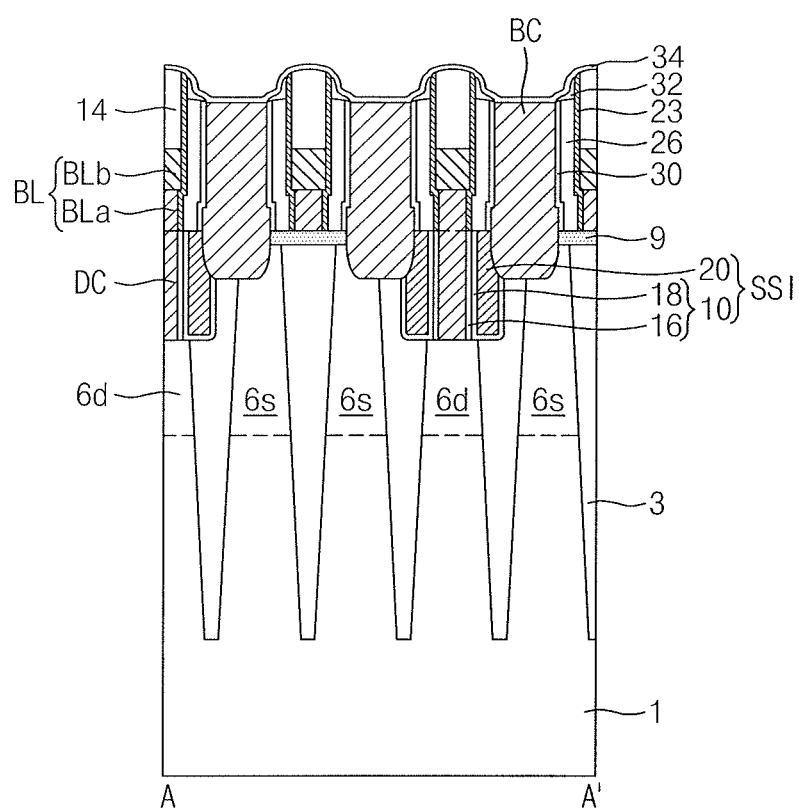

Referring to FIGS. 28 and 29, the storage node contact hole BH may be filled with a conductive film. For example, the conductive film may be formed by stacking a polysilicon film doped with an impurity. The conductive film may be recessed to form the storage node contact BC having an upper surface which is lower than the upper surface of the second capping film pattern 14. Thereafter, the diffusion prevention pattern 34 may be formed.

By way of summation and review, exemplary embodiments are directed to a semiconductor device with improved reliability and a method of manufacturing the same. That is, according to the exemplary embodiments, a material having a relatively low-k dielectric can be provided to a spacer disposed on a sidewall of a bit line node contact. Disturbance between the bit line node contact and a storage node contact can be reduced. Loading capacitance between the bit line node contact and the storage node contact can be reduced. Reliability of a miniaturized semiconductor device can be improved. A distance between the storage node contact and a bit line can be reduced such that a semiconductor device optimized for high integration can be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a first impurity implantation region and a second impurity implantation region in a substrate, such that the first impurity implantation region is spaced apart from the second impurity implantation region;
    forming an insulating film on the substrate, such that the first impurity implantation region is covered and the second impurity implantation region is exposed;
    removing a portion of the substrate using the insulating film as an etch mask to form a bit line node contact hole;
    forming a bit line node contact in bit line node contact hole and forming a bit line on the insulating film and the bit line node contact, the bit line including a first bit line and a second bit line on the first bit line;
    forming a spacer covering sidewalls of the bit line and the bit line node contact; and
    forming a storage node contact in contact with the spacer and the first impurity implantation region,
    wherein forming the spacer includes:
    forming a first sub-spacer in contact with the sidewall of the bit line node contact; and
    forming a first bit line spacer in contact with the sidewall of the bit line, the first sub-spacer is formed to include a material having a dielectric constant that is lower than that of the first bit line spacer.

2. The method of manufacturing a semiconductor device as claimed in claim 1, wherein forming the spacer includes: forming a second sub-spacer covering the first sub-spacer and a sidewall of the bit line node contact hole.

3. The method of manufacturing a semiconductor device as claimed in claim 2, wherein forming the spacer includes:
    forming a third sub-spacer filling the bit line node contact hole.

4. The method of manufacturing a semiconductor device as claimed in claim 3, wherein forming the first sub-spacer includes:
    forming a first sub-spacer layer by oxidizing a surface of the first bit line and a surface of the bit line node contact.

5. The method of manufacturing a semiconductor device as claimed in claim 4, wherein forming the first sub-spacer layer includes:
    forming a step on the sidewall of the bit line.

6. The method of manufacturing a semiconductor device as claimed in claim 5, wherein a width of the first bit line is narrower than a width of the second bit line.

7. The method of manufacturing a semiconductor device as claimed in claim 4, wherein the first sub-spacer is formed by a plasma thermal oxidation process.

8. The method of manufacturing a semiconductor device as claimed in claim 4, wherein forming the second sub-spacer includes:
    forming a second sub-spacer layer covering the first sub-spacer layer, the second bit line, the sidewall of the bit line node contact hole, and the insulating film.

9. The method of manufacturing a semiconductor device as claimed in claim 8, wherein forming the third sub-spacer includes:
    forming a third sub-spacer layer covering the second sub-spacer layer; and
    partially removing the third sub-spacer layer to expose a portion of the second sub-spacer layer.

10. The method of manufacturing a semiconductor device as claimed in claim 9, wherein forming the first sub-spacer and forming the second-sub spacer includes:
    exposing the bit line by removing the exposed portion of the second sub-spacer layer and a portion of the first sub spacer layer.

11. The method of manufacturing a semiconductor device as claimed in claim 3, wherein forming the spacer includes:
    forming a second bit line spacer on the first bit line spacer, the second bit line in contact with the second sub-spacer and the third-sub spacer; and
    forming a third bit line spacer on the second bit line spacer.

12. The method of manufacturing a semiconductor device as claimed in claim 11, wherein forming the first bit line spacer includes:
    forming a first bit line spacer layer covering the sidewall of the bit line, upper ends of each of the first sub-spacer and second sub-spacers, an upper surface of the third sub-spacer, and an upper surface of the insulating film; and
    forming a first bit line spacer pattern by removing a portion of the first bit line spacer layer to expose the upper end of the second sub-spacer, the upper surface of the third sub-spacer layer, and a portion of the upper surface of the insulating film.

13. The method of manufacturing a semiconductor device as claimed in claim 12, wherein forming the second bit line spacer includes:
    forming a second bit line spacer layer covering the first bit line spacer pattern, the upper end of the second sub-spacer, the upper surface of the third sub-spacer, and the upper surface of the insulating film; and etching partially the second bit line spacer layer to expose an upper portion of the first bit line spacer pattern, a portion of the upper end of the second sub-spacer, a portion of the upper surface of the third sub-spacer, and a portion of the upper surface of the insulating film.

14. The method of manufacturing a semiconductor device as claimed in claim 13, wherein forming the third bit line spacer includes:

forming a third bit line spacer layer covering the second bit line spacer, the upper portion of the first bit line spacer pattern, the portion of an upper portion of the second sub-spacer, the portion of the upper surface of the third sub-spacer, and the portion of the upper surface of the insulating film.

15. The method of manufacturing a semiconductor device as claimed in claim 1, wherein the first sub-spacer includes an oxide, and the first bit line spacer includes a nitride.

16. A method of manufacturing a semiconductor device, the method comprising:

forming a first impurity implantation region and a second impurity implantation region in a substrate, such that the first impurity implantation region is spaced apart from the second impurity implantation region;

forming an insulating film on the substrate, such that the first impurity implantation region is covered and the second impurity implantation region is exposed;

removing a portion of the substrate using the insulating film as an etch mask to form a bit line node contact hole;

forming a bit line node contact in bit line node contact hole and forming a bit line on the insulating film and the bit line node contact, the bit line including a first bit line and a second bit line on the first bit line;

forming a spacer covering sidewalls of the bit line and the bit line node contact; and forming a storage node contact in contact with the spacer and the first impurity implantation region, wherein the forming the spacer includes:

oxidizing sidewalls of the first bit line and the bit line node contact by a selective oxidation process to form a first sub-spacer layer;

forming a second sub-spacer layer covering sidewalls of the first sub-spacer layer and the bit line node contact hole;

forming a third sub-spacer layer filling the bit line node contact hole on the second sub-spacer;

removing portions of each of the first sub-spacer layer, the second sub-spacer layer, and the third sub-spacer layer to form a first sub-spacer, a second sub-spacer, and a third sub-spacer; and forming a first bit line spacer covering the sidewall of the bit line and in contact with the first sub-spacer.

17. The method of manufacturing a semiconductor device as claimed in claim 16, wherein the method further comprises:

forming a step on the sidewall of the bit line through the selective oxidation process; and forming a step on a sidewall of the spacer.

18. The method of manufacturing a semiconductor device as claimed in claim 16, wherein the method further comprises:

forming a step on a sidewall of the storage node contact in contact with the spacer.

19. The method of manufacturing a semiconductor device as claimed in claim 16, wherein the storage node contact includes:

an upper contact having a first width and a lower contact having a second width greater than the first width.

20. A method of manufacturing a semiconductor device, the method comprising:

forming a first impurity implantation region and a second impurity implantation region in a substrate, such that the first impurity implantation region is spaced apart from the second impurity implantation region;

forming an insulating film on the substrate, such that the first impurity implantation region is covered and the second impurity implantation region is exposed;

removing a portion of the substrate using the insulating film as an etch mask to form a bit line node contact hole;

forming a bit line node contact in bit line node contact hole and forming a bit line on the insulating film and the bit line node contact, the bit line including a first bit line and a second bit line on the first bit line, each of a width of the first bit line and a width of the bit line node contact is narrower than a width of the second bit line;

forming a lower spacer covering a sidewall of the bit line node contact, the lower spacer including contact spacer having an oxide;

forming an upper spacer covering a sidewall of the bit line, wherein the upper spacer including bit line spacer having a nitride, the bit line spacer in contact with the contact spacer; and forming a storage node contact in contact with the spacer and the first impurity implantation region.

* * * * *